(12) United States Patent
Lawrence et al.

(10) Patent No.: US 12,160,970 B2
(45) Date of Patent: Dec. 3, 2024

(54) CABLE HARNESS WITH HYBRID HIGH SPEED SIGNAL AND POWER CONNECTORS

(71) Applicant: Molex, LLC, Lisle, IL (US)

(72) Inventors: Tommy Lawrence, Little Rock, AR (US); Robert Dillman, Santa Clara, CA (US); Michael David Rost, Taipei (TW); Jeffrey Alan Joniak, Homer Glen, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 18/687,832

(22) PCT Filed: Aug. 18, 2023

(86) PCT No.: PCT/IB2023/058286
§ 371 (c)(1),
(2) Date: Feb. 29, 2024

(87) PCT Pub. No.: WO2024/042436
PCT Pub. Date: Feb. 29, 2024

(65) Prior Publication Data
US 2024/0276669 A1     Aug. 15, 2024

Related U.S. Application Data

(60) Provisional application No. 63/401,142, filed on Aug. 26, 2022.

(51) Int. Cl.
*H05K 7/14* (2006.01)
*H01B 7/00* (2006.01)
*H01R 13/518* (2006.01)

(52) U.S. Cl.
CPC ......... *H05K 7/1452* (2013.01); *H01B 7/0045* (2013.01); *H01R 13/518* (2013.01)

(58) Field of Classification Search
CPC .. H05K 7/1438; H05K 7/1439; H05K 7/1447; H05K 7/1448; H05K 7/1449;
(Continued)

(56) References Cited

U.S. PATENT DOCUMENTS

| 10,424,878 B2 | 9/2019 | Lloyd |
| 2005/0041389 A1 | 2/2005 | Martin |

(Continued)

FOREIGN PATENT DOCUMENTS

| CN | 103718658 A | 4/2014 |
| CN | 104244655 A | 12/2014 |

(Continued)

OTHER PUBLICATIONS

International Search Report and Written Opinion issued in PCT Application No. PCT/IB2023/058286, mailed on Nov. 28, 2023, 11 pages.

*Primary Examiner* — Khiem M Nguyen

(57) ABSTRACT

A cable harness for use in a backplane is provided. The cable harness includes a primary hybrid signal and power backplane connector having a primary housing. The primary housing includes a primary signal pair element and a primary power connector. The cable harness also includes a secondary hybrid signal and power backplane connector having a secondary housing. The secondary housing includes a secondary signal pair element and a secondary power connector. The primary hybrid signal and power backplane connector is connected with the secondary hybrid signal and power backplane connector with a signal cable. Each of the primary and secondary hybrid signal and power backplane connectors is electrically connected with a power supply unit each via a power cable.

20 Claims, 30 Drawing Sheets

(58) Field of Classification Search
CPC .. H05K 7/1452; H05K 7/1457; H01B 7/0045; H01B 7/0054; H01R 13/514; H01R 13/516; H01R 13/518
USPC ............................................ 439/540.1, 541.5
See application file for complete search history.

(56) References Cited

U.S. PATENT DOCUMENTS

| | | |
|---|---|---|
| 2005/0085103 A1 | 4/2005 | Driscoll |
| 2011/0170270 A1 | 7/2011 | Inoue |
| 2014/0240909 A1 | 8/2014 | Stewart |
| 2015/0116976 A1 | 4/2015 | Ritter |
| 2015/0163950 A1 | 6/2015 | Sechrist |
| 2016/0226203 A1 | 8/2016 | Bradley |
| 2018/0034175 A1* | 2/2018 | Lloyd .................... H01R 24/60 |

FOREIGN PATENT DOCUMENTS

| | | |
|---|---|---|
| CN | 105531875 A | 4/2016 |
| JP | 2007128498 A | 5/2007 |
| JP | 2016511528 A | 4/2016 |
| JP | 2017033919 A | 2/2017 |
| JP | 2019153593 A | 9/2019 |

* cited by examiner

CABLE HARNESS WITH HYBRID HIGH SPEED SIGNAL AND POWER CONNECTORS

RELATED APPLICATIONS

This application is a U.S. National Phase Patent Application of International Patent Application No. PCT/IB2023/058286, filed on Aug. 18, 2023, which claims the benefit of and priority to U.S. Provisional Patent Application No. 63/401,142 filed Aug. 26, 2022, the contents of which being incorporated by reference in their entirety herein.

FIELD OF THE DISCLOSURE

The present disclosure relates generally to backplane connectors, and, more particularly, to an improved cable harness with combined high speed signal and power connectors to be utilized in backplane applications.

BACKGROUND

Existing backplane connectors utilize waferized structures for signal connectors which can be prohibitively expensive to tool-up. Wafers are designed to support a set number of signal pairs and ground elements associated with the signal pairs. These elements are supported by a frame typically formed from a thermoplastic and molded over portions of the signal and ground elements. As such, each particular wafer requires its own mold and stamping and forming operation. Thus, the costs required to tool up waferized connectors are large.

Existing backplane cable connectors that utilize a wafer construction do not easily support wiring schemes that are more complex than connecting all pairs from one column to another column. "Lettered" wiring schemes, such as W, X and Y wiring schemes where the pairs track the configuration of the particular letter are difficult to construct. A need therefore exists for a backplane connector having a signal connector that utilizes signal pair components that reduce the cost of manufacturing.

Additionally, existing backplanes utilize separate connectors for power signals and high speed data signals with each connector having its own housing. In particular, traditional power connectors often form a large structure and which prevents or blocks airflow from an outside of a case to an inside of the case, wherein the backplane along with a number of components such as power supplies reside. Blocking airflow into the case causes temperatures to rise within the case above acceptable limits and prevents certain components, such as power supplies and CPUs, from obtaining proper cooling. A need therefore exists for a backplane connector that can provide improved cooling and that can reduce the cost of manufacturing.

Accordingly, there is a need for an improved backplane connector. The Present Disclosure is directed to an improved backplane connector that utilizes combined signal pair elements and power connectors which share a common housing to overcome the aforementioned disadvantages.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
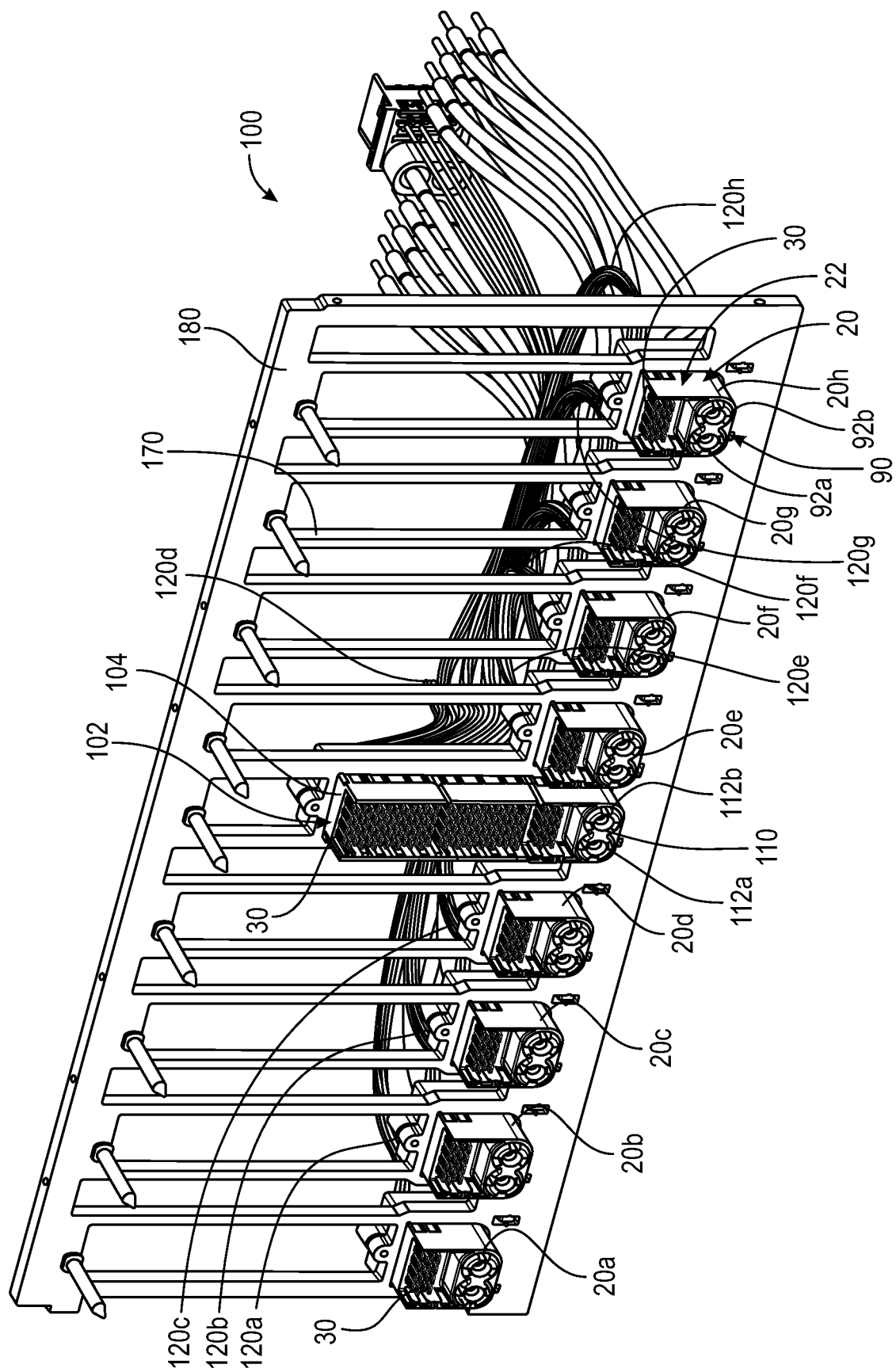
FIG. 1 is a front perspective view of a cable harness mounted within slots of a backplate, wherein the cable harness has multiple hybrid backplane connectors with power connectors located beneath the signal pair elements, in accordance with one embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Methods and devices consistent with the present disclosure overcome the disadvantages of conventional backplane connectors. The Present Disclosure is directed to an improved backplane connector that utilizes combined signal pair elements and power connectors which share a common housing to overcome the aforementioned disadvantages and provide a backplane connector with improved cooling and reduced cost of manufacturing.

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

FIG. 1 illustrates a cable harness 100 for use as a backplane comprising a primary hybrid signal and power backplane connector 102 connected with eight secondary hybrid signal and power backplane connectors 20a-20h via bundles 120a-120h of signal cables 48. As shown, the cable harness is mounted in between slots 170 of a backplate 180 for a case (not shown). Each signal cable 48 transmits data between a primary signal pair element 30a located on the primary backplane connector 102 and a corresponding secondary signal pair element 30b on one of the secondary backplane connectors 20.

The primary backplane connector 102 includes a primary connector housing 104 having an array of primary signal pair elements 30a located within the primary connector housing 104, and a primary power connector 110a located within the primary connector housing 104 including a pair of high current interconnects 112a and 112b. Each backplane connector 20 or 102 includes a connector housing 22, an array of signal pair elements 30 located within the connector housing 22 each having a pair of elongated signal terminals 32a and 32b, and a power connector 110 located within the connector housing 22 and including a pair of high current interconnects.

Figure 2:
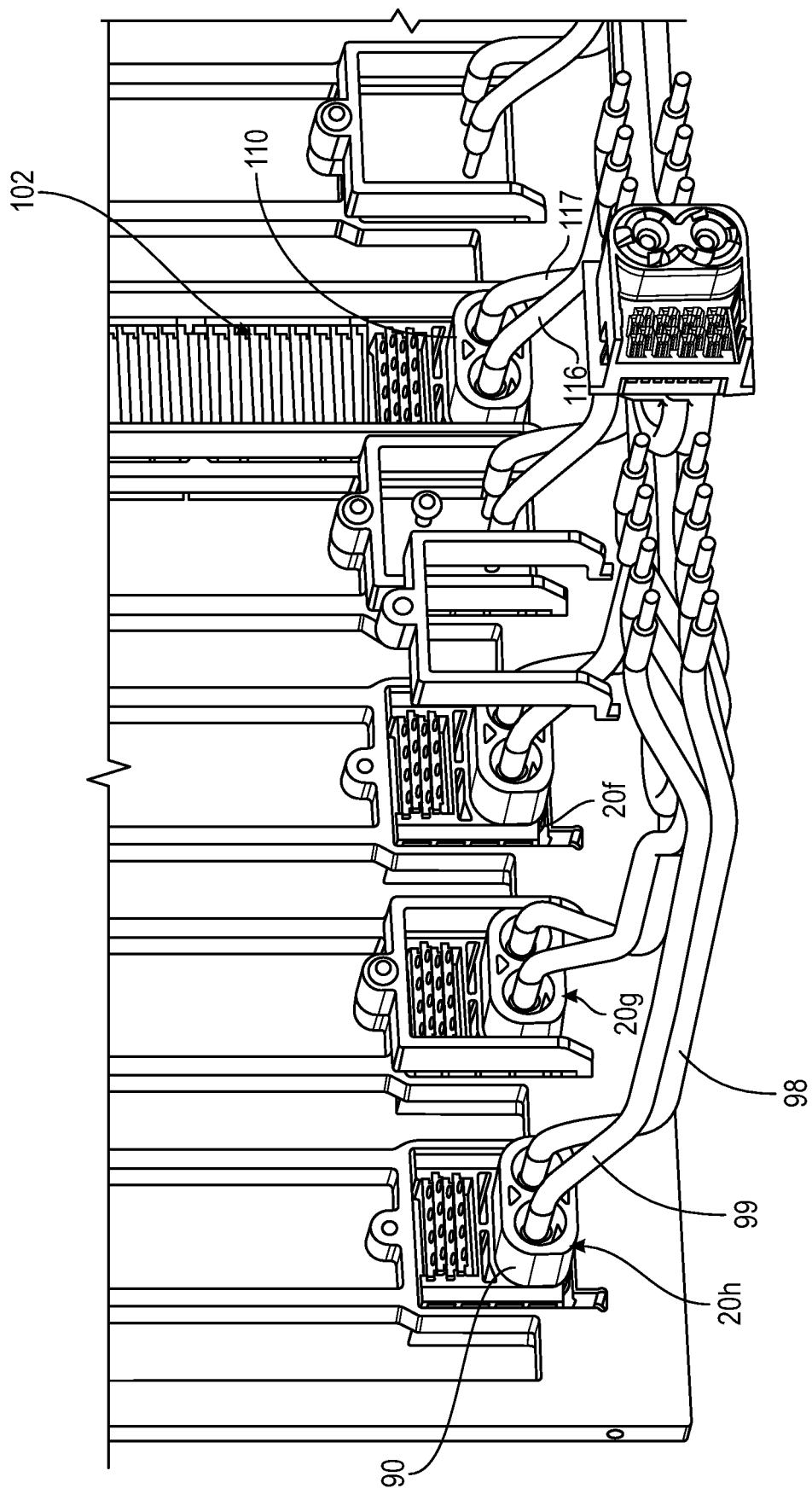
FIG. 2 is a partial rear perspective view of the cable harness shown in FIG. 1, in accordance with one embodiment of the present invention.

Each secondary backplane connector 20 includes a connector housing 22, an array of signal pair elements 30 located within the connector housing 22 each having a pair of elongated signal terminals 32a and 32b, and a power connector 110b located within the connector housing 22 and including a pair of high current interconnects 92a and 92b. With reference to FIG. 2, a pair of primary power cables 116, 117 connects the primary power connector 110a with a power supply unit while a pair of secondary power cables 98, 99 connect the secondary power connector 110b with a power supply unit.

Figure 8:
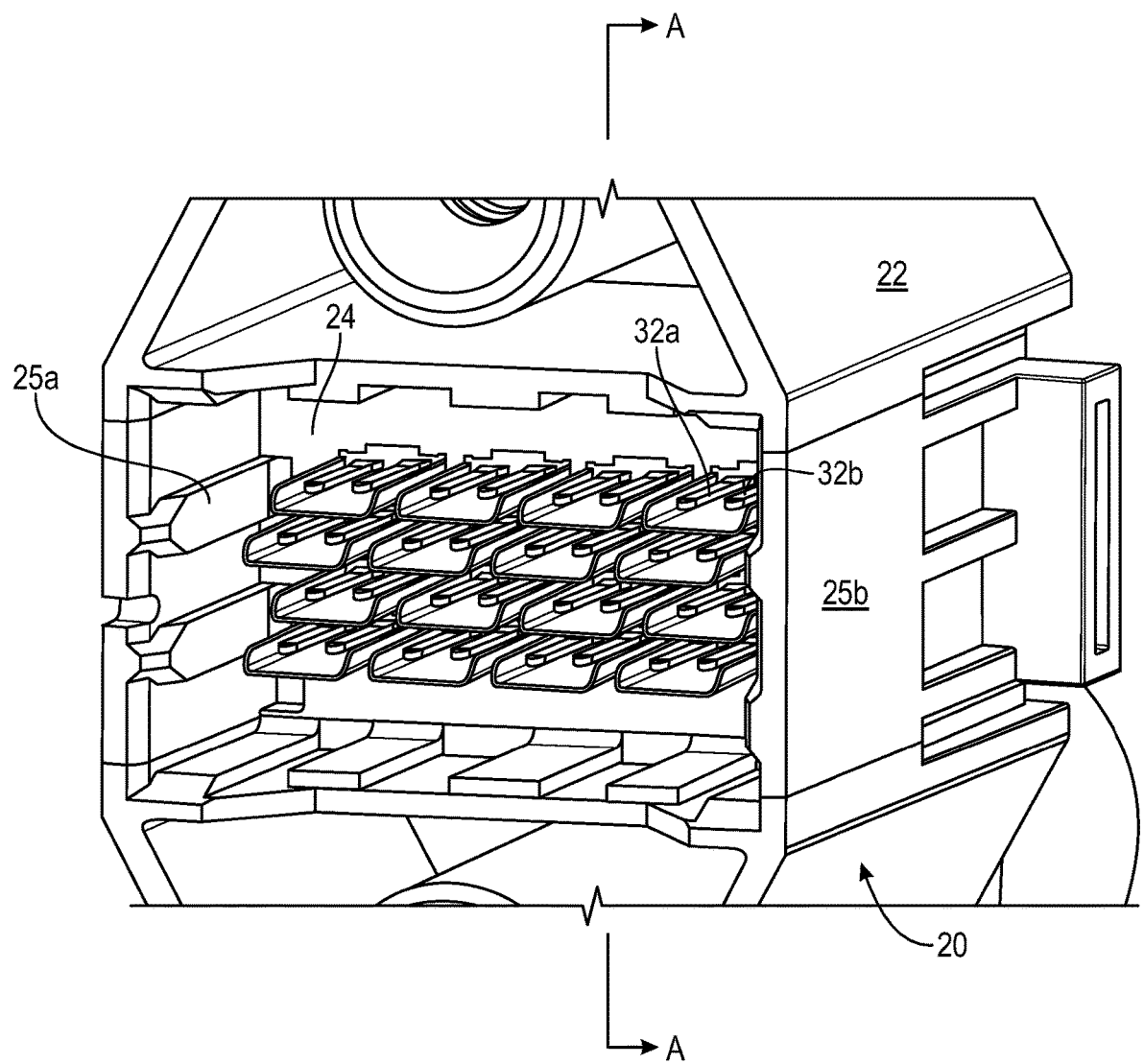
FIG. 8 is a perspective view of a backplane connector utilizing a plurality of individual signal pair elements, in accordance with one embodiment of the present invention.
Figure 9A:
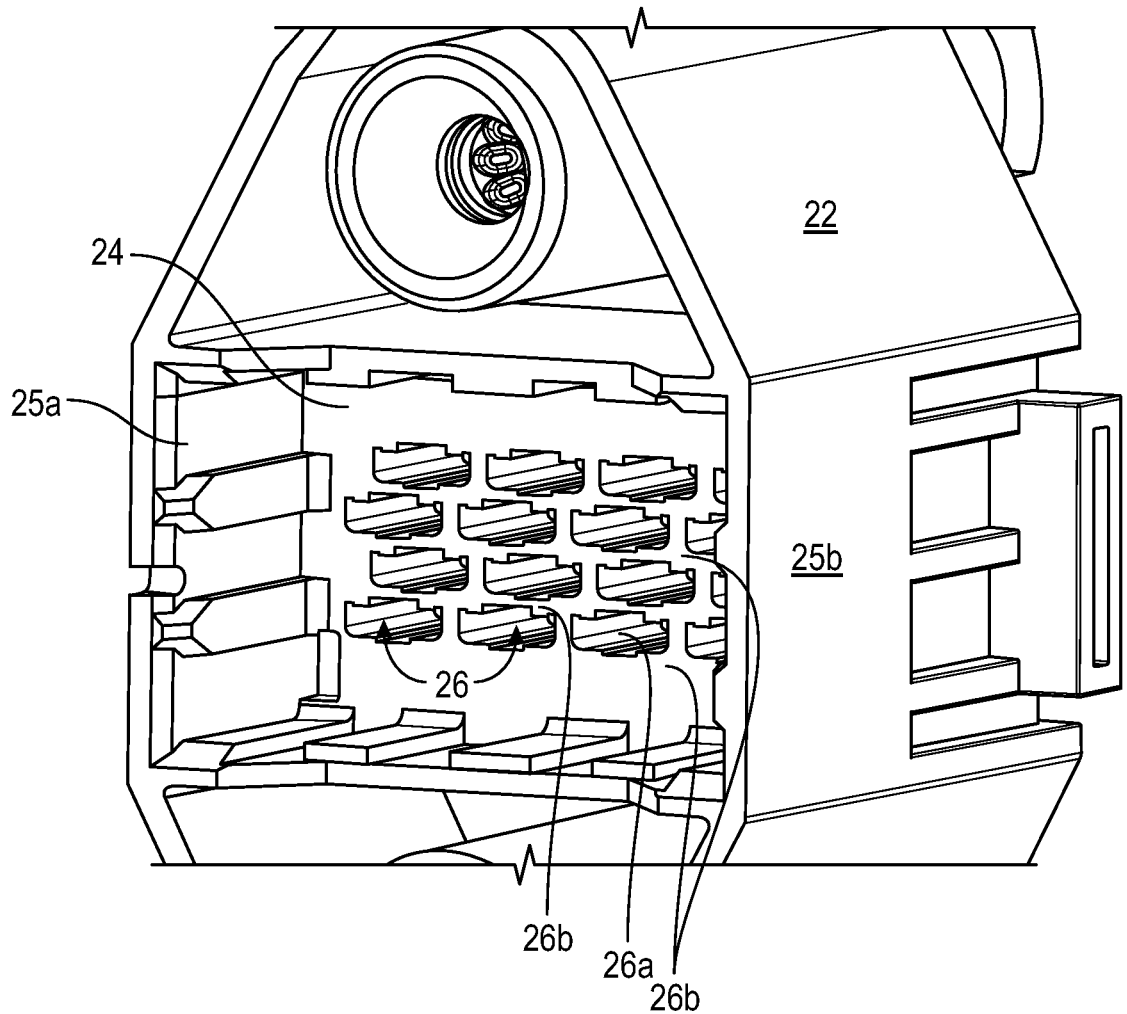
FIG. 9A is the same view as FIG. 8, but with all of the signal pair elements removed from the backplane connector frame.
Figure 9B:
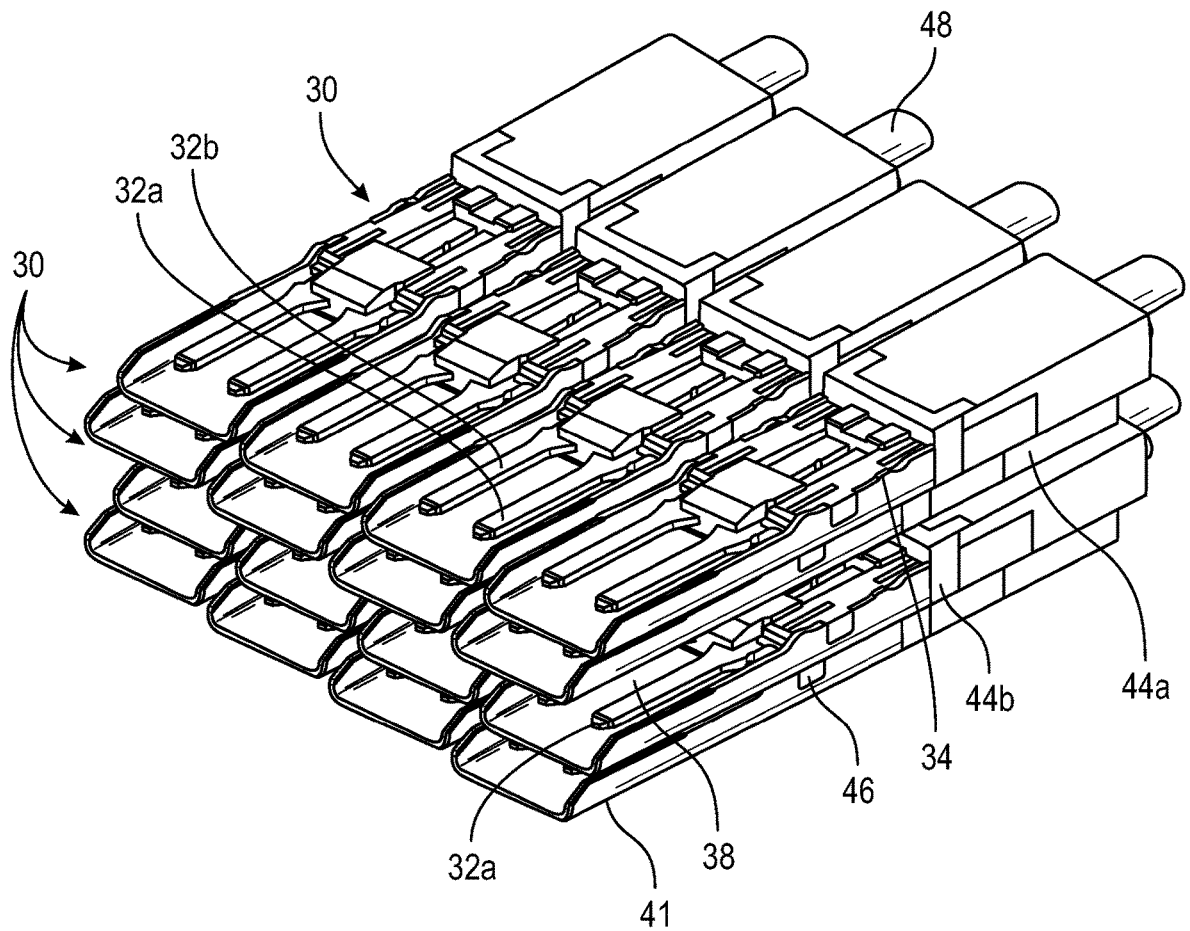
FIG. 9B is a perspective view of the signal pair elements removed from the backplane connector frame shown in FIG. 9A.

FIG. 8 illustrates one secondary backplane connector 20 that utilizes an insulative connector housing 22 with a flat base portion 24 and one or more sidewalls 25a and 25b that extend out from the base portion 24 to define a slot therebetween. The housing base portion 24, as illustrated best in FIG. 9 has a plurality of openings 26 formed therein in a desired arrangement. In FIG. 9, the arrangement is one of staggered openings. Conductive signal and ground elements extend through and out of these openings as will be explained in greater detail to follow.

Figure 3:
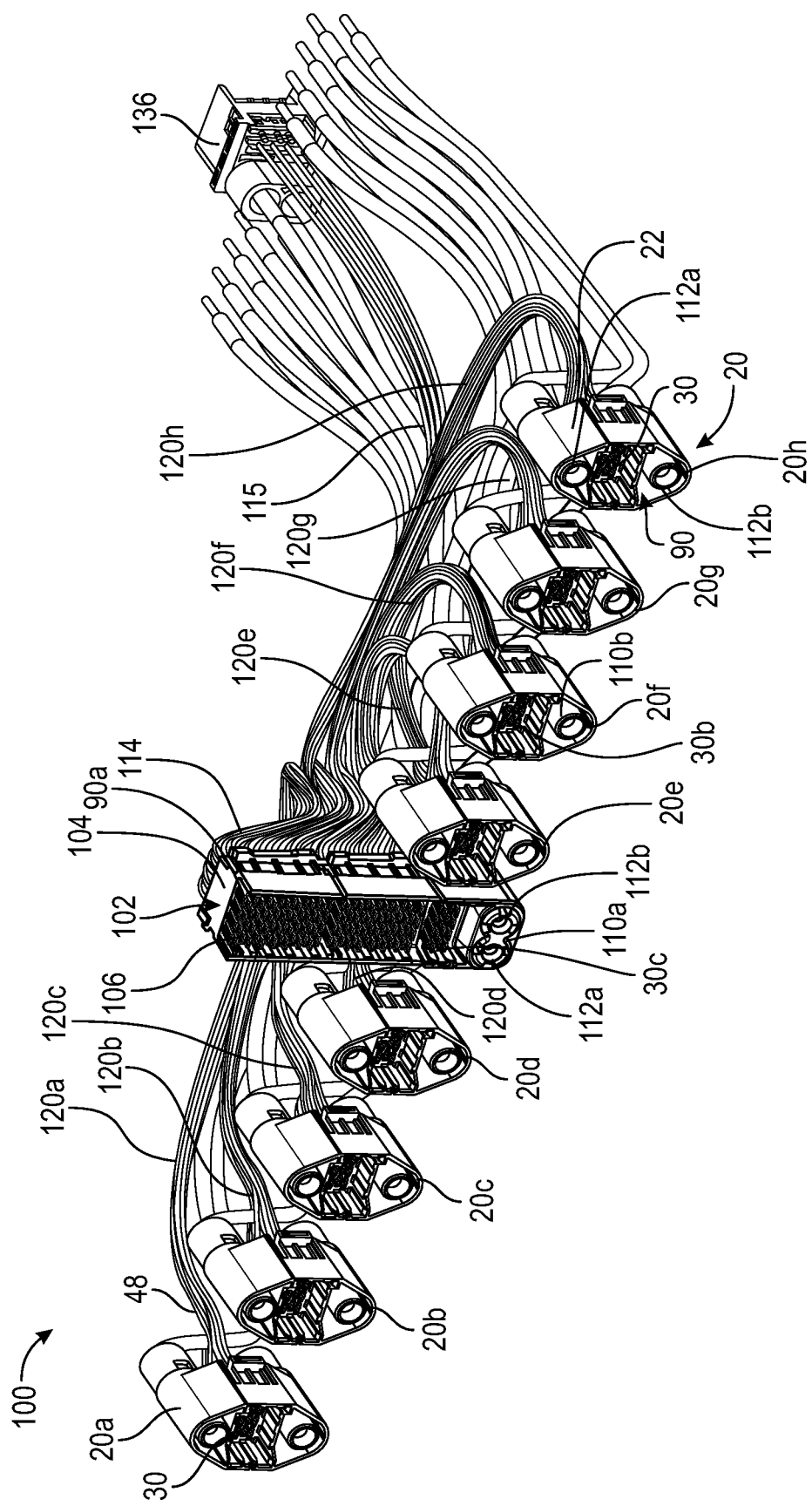
FIG. 3 is a front perspective view of a cable harness having multiple hybrid backplane connectors with power connectors located above and beneath the signal pair elements, in accordance with one embodiment of the present invention.

With reference to FIG. 3, secondary backplane connector 20 is representative of any secondary backplane connector 20a-20h and has elements, such as signal pair elements 30 and power connectors 110. Secondary signal pair elements 30b and power connectors 110b are found in secondary backplane connector 20. Primary and secondary signal pair elements 30a, 30b each comprise at least one or more signal pair elements 30, and primary and secondary power connectors 110a, 110b comprise at least one power connector 110.

In one embodiment, primary backplane connector 102 also includes tertiary signal pair elements 30c which receive signals from the switch or control card and transmit those signals to servers, GPUs or other devices for the purpose of intercommunication. Tertiary signal pair elements 30c are found in primary backplane connector 102 and comprise at least one or more of signal pair elements 30.

Figure 13:
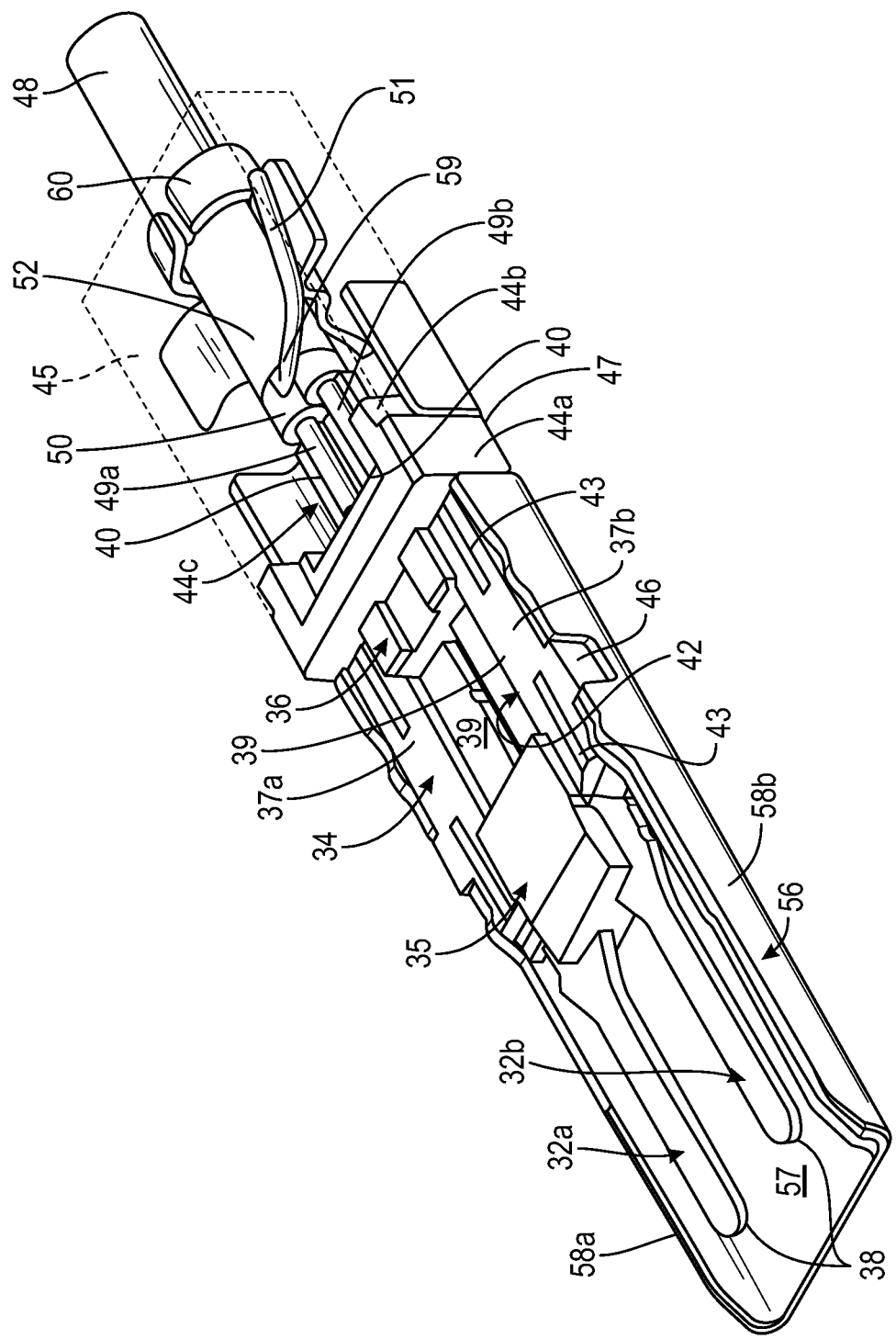
FIG. 13 is a perspective view of an individual signal pair element utilized in the backplane connector of FIG. 8, with the rear, overmolded portion shown in phantom for clarity.

As shown in FIG. 13, the Present Disclosure provides a plurality of individual signal pair elements, or chicklets, 30, which are insertable into the connector housing 22 or connector housing 104 such that the conductive elements thereof project through the connector housing openings 26 in alignment with an opposing mating connector (not shown). Each signal pair element 30 includes a pair of elongated, conductive signal terminals 32a and 32b that extend longitudinally of the element 30. The signal terminals 32a and 32b have respective opposing contact portions 38 and tail portions 40 which are interconnected by intervening body portions 39.

Figure 12:
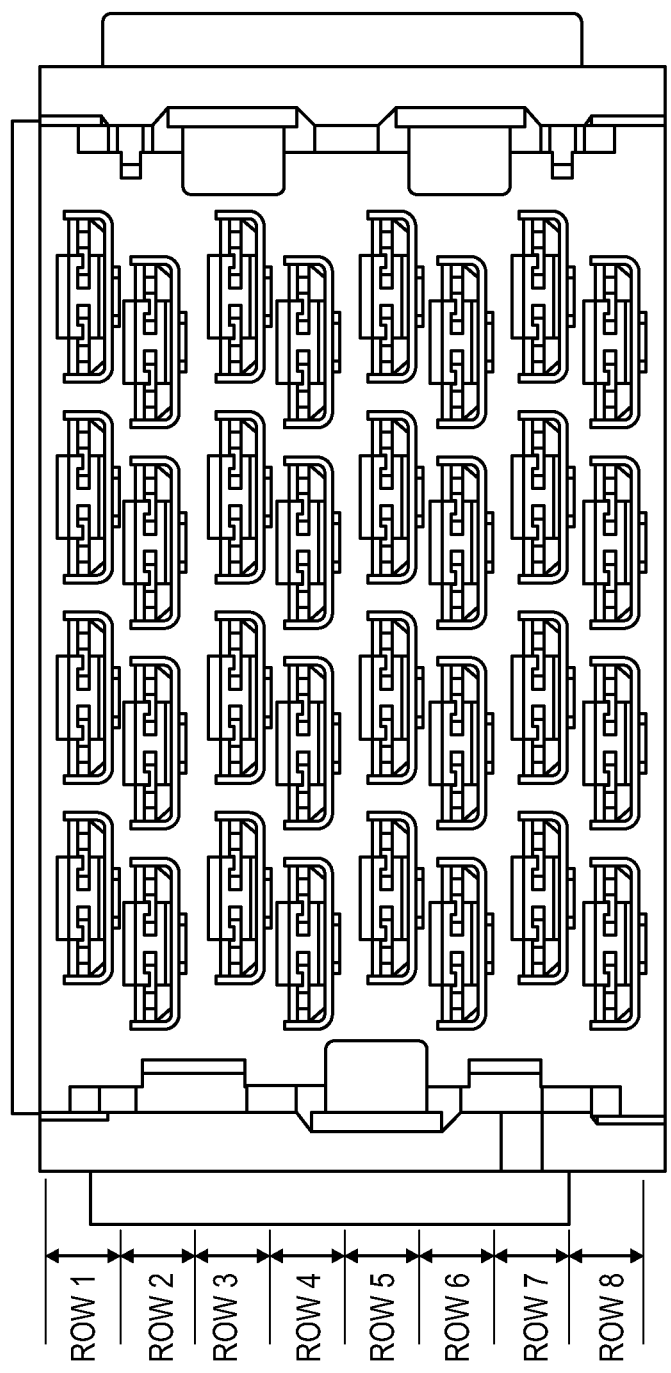
FIG. 12 is a bottom plan view of the backplane connector of FIG. 8, illustrating the arrangement of individual signal pair elements supported within the connector frame.

In practice, the terminals are spaced from the inside surface of the ground shield sidewalls a distance L and the terminals of the pair are preferably spaced apart a distance equal to about or equal to 2L as a preferred spacing. The terminals are also preferably spaced above the ground shield a height of about 40% of the height from the inner surface of the ground shield base to the top edge, with "top" taking the orientation as shown in FIG. 12.

Figure 16:
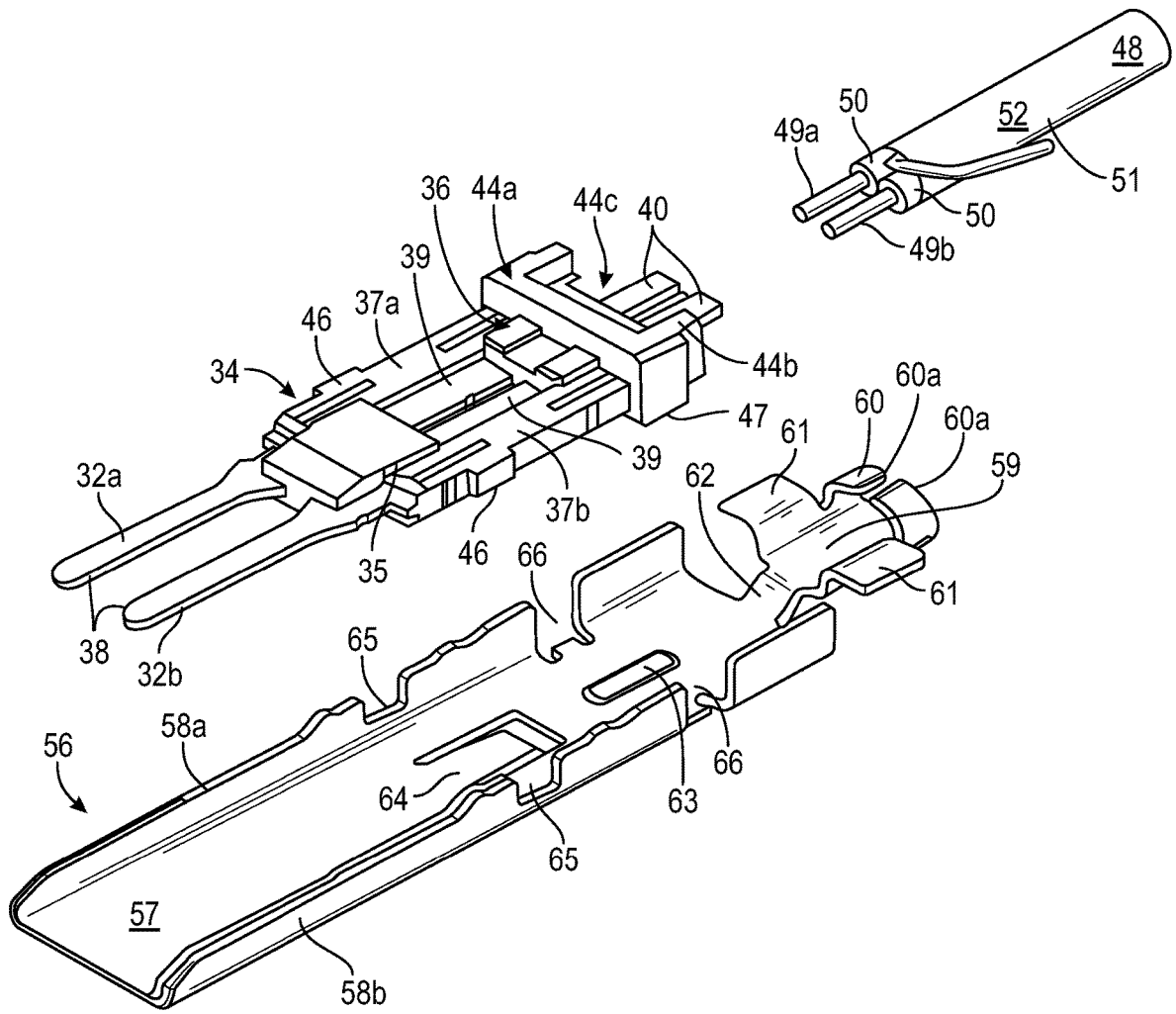
FIG. 16 is the same view as FIG. 15, but with the signal pair cable wires removed from the signal pair assembly for clarity.
Figure 17:
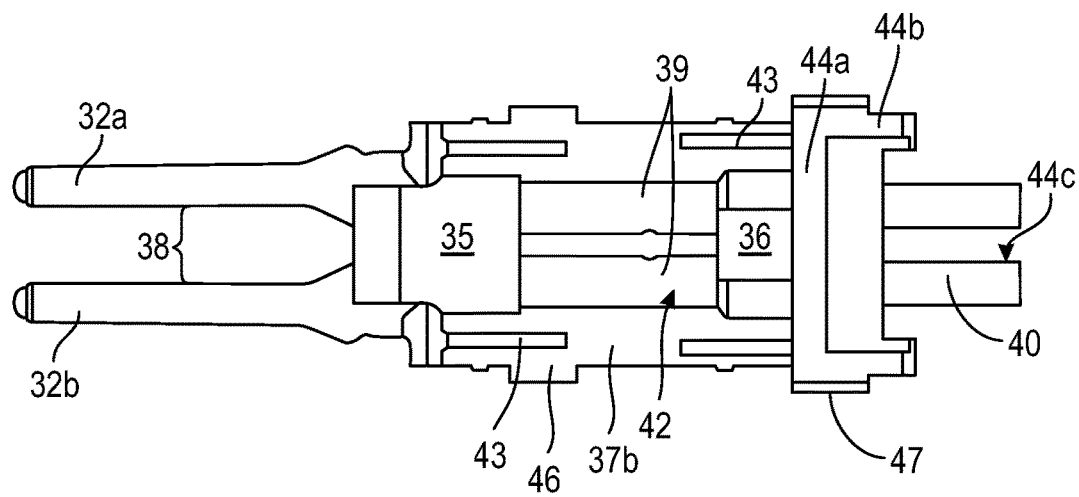
FIG. 17 is a top plan view of the two signal terminals supported by their insulative frame.
Figure 20:
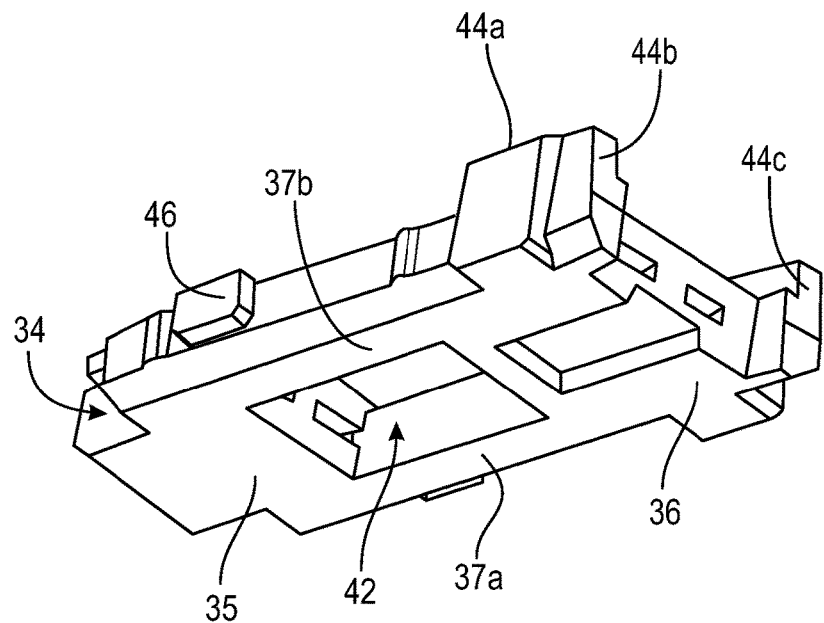
FIG. 20 is a perspective view, taken from the bottom, of the support frame with the terminals removed for clarity.
Figure 21:
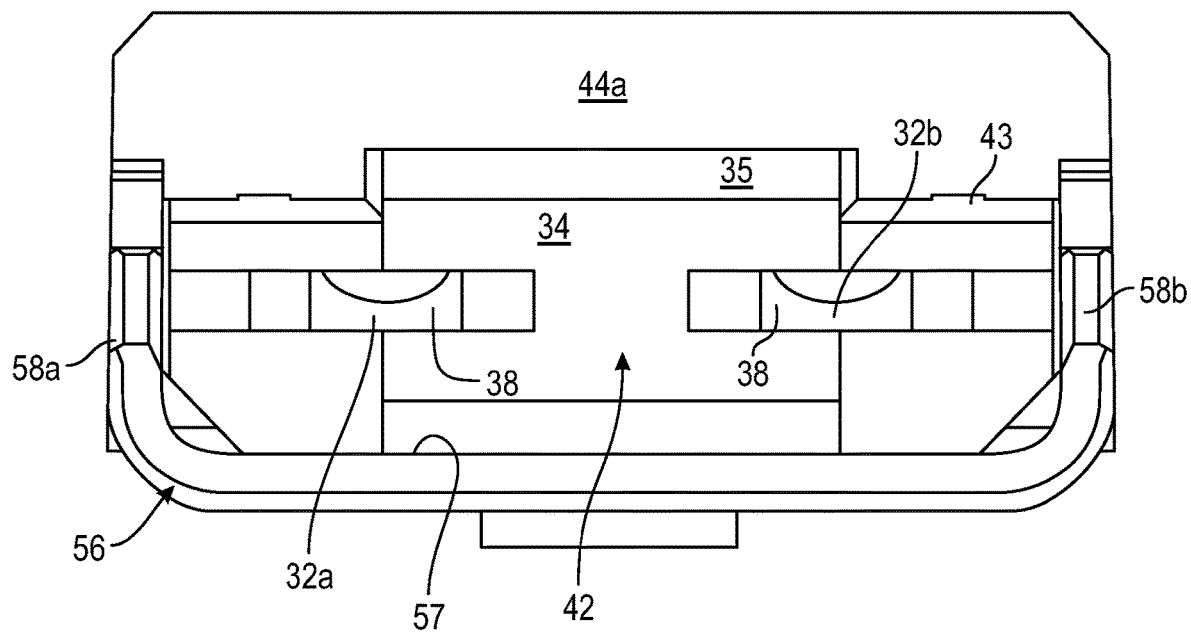
FIG. 21 is a front elevational view of a signal pair element.
Figure 22:
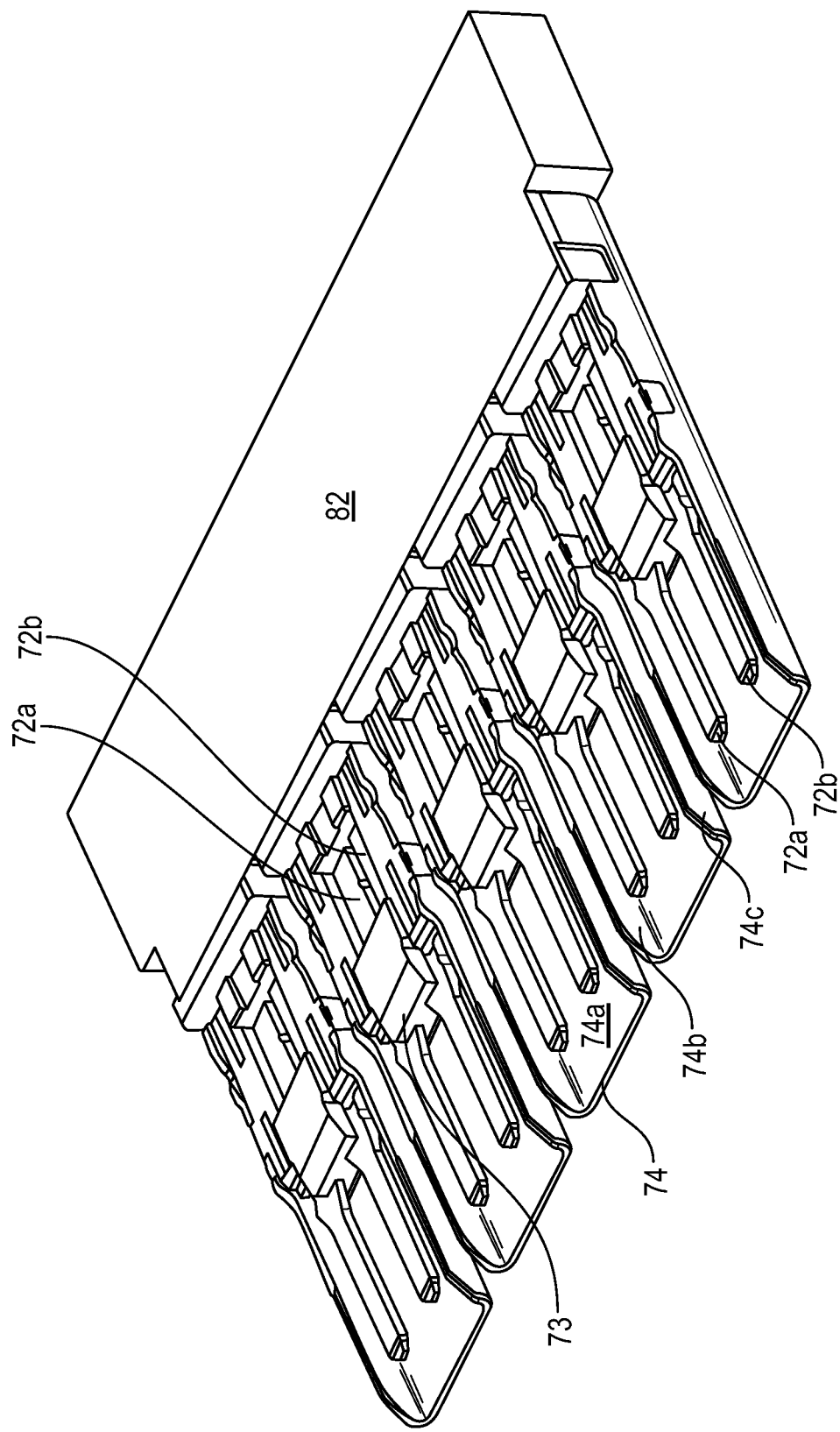
FIG. 22 is a perspective view of another embodiment, wherein a plurality of signal pair elements are integrated together into a row of single, signal pair elements.
Figure 23:
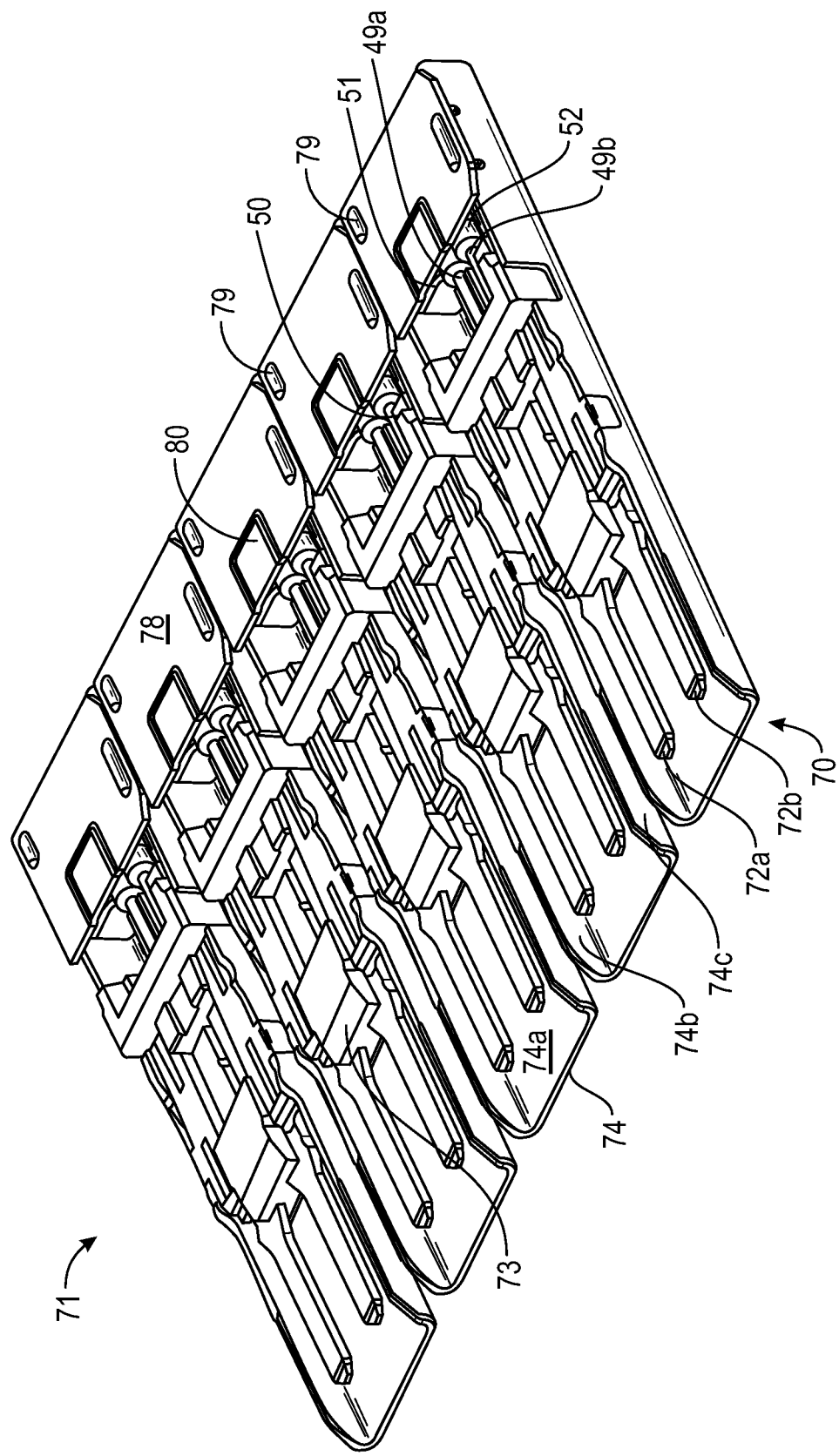
FIG. 23 is the same view as FIG. 22, but with the insulative overmold removed for clarity to illustrate how the commoning strap interconnects the individual signal pair elements.
Figure 24:
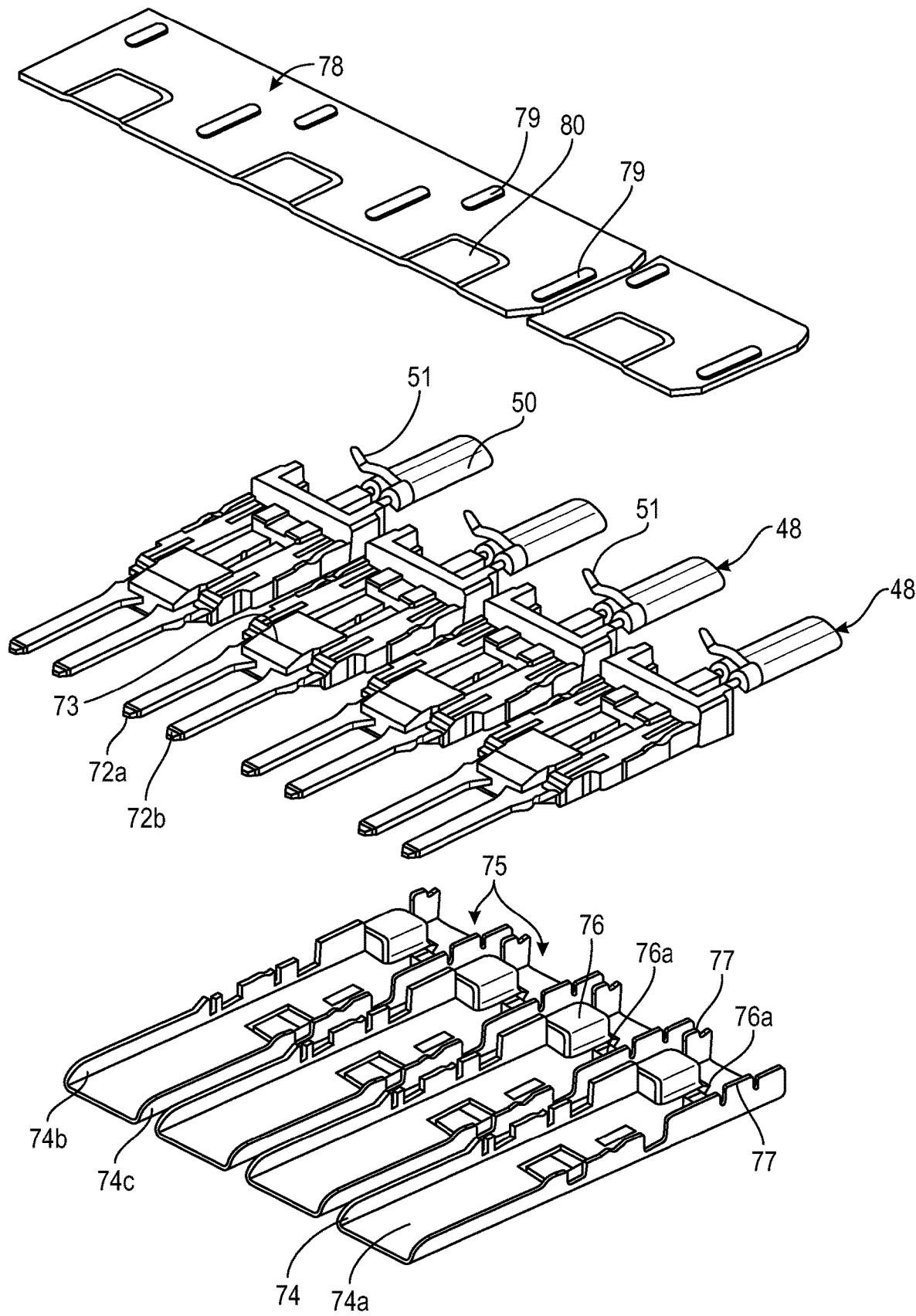
FIG. 24 is an exploded view of the ganged assembly of FIG. 23.
Figure 25:
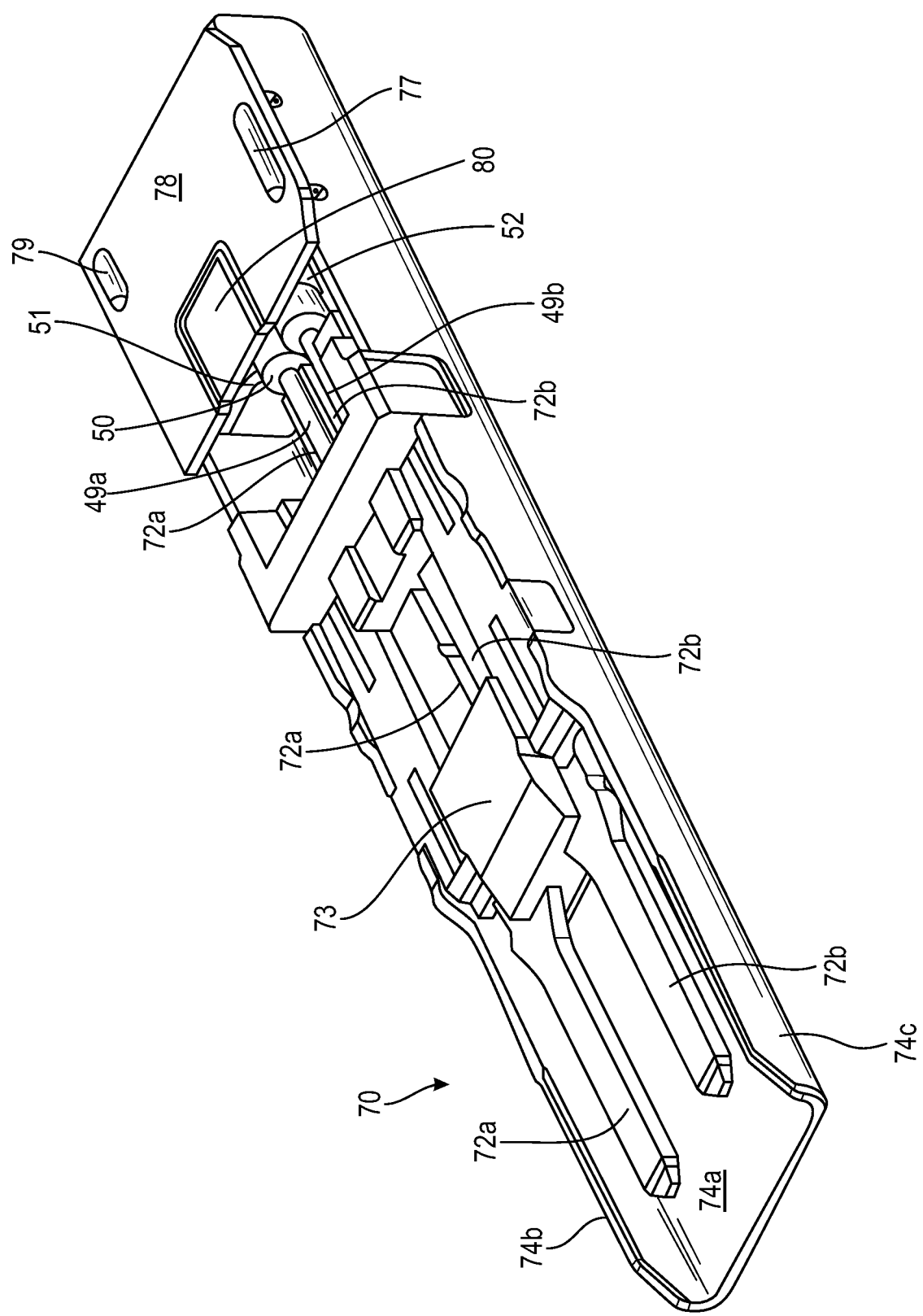
FIG. 25 is a perspective view of a single signal pair element used in the ganged assembly of FIG. 22.
Figure 26:
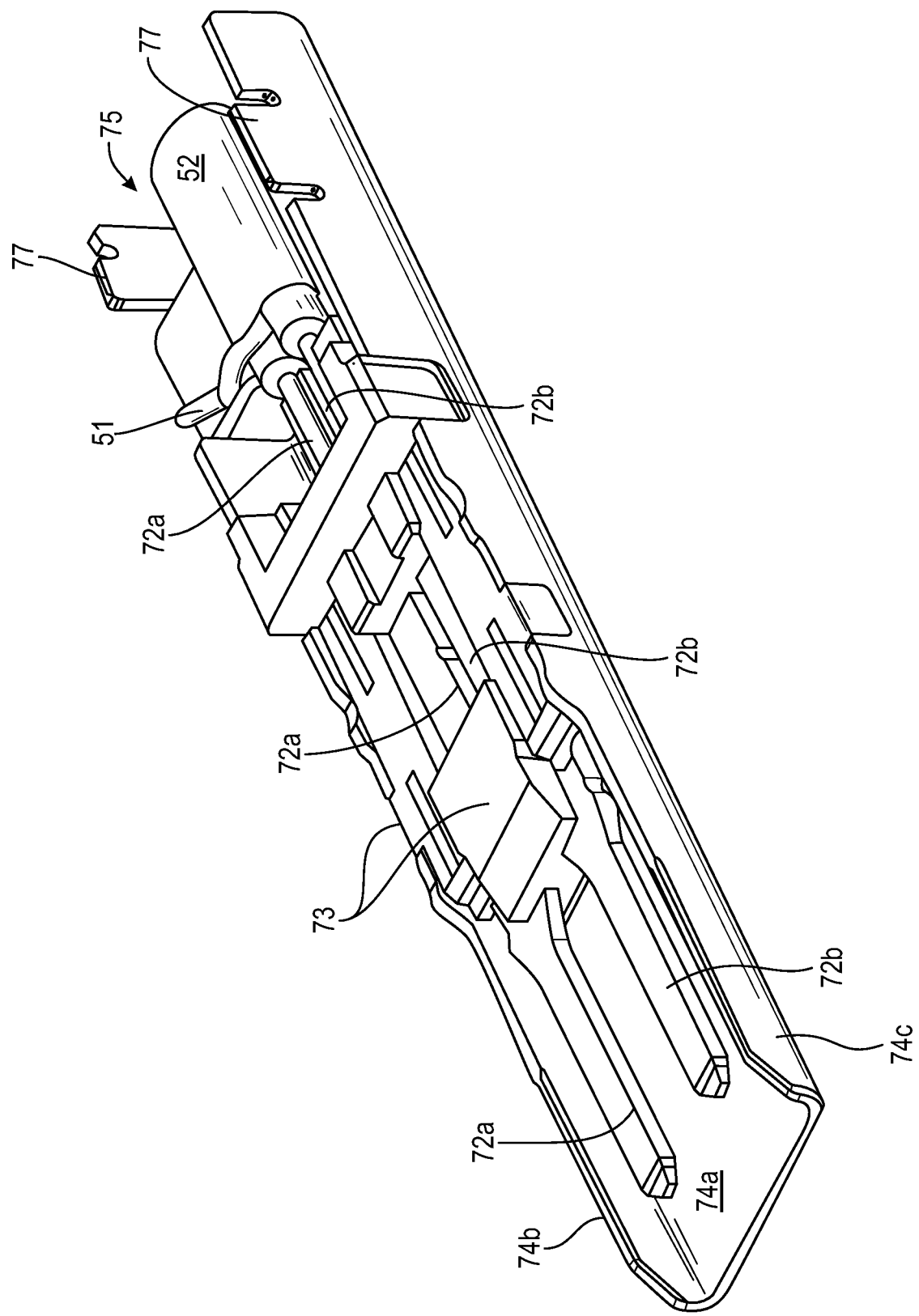
FIG. 26 is the same view as FIG. 25, but with the commoning strap removed for clarity.

The terminals 32a and 32b are supported in an insulative frame 34 that includes a front mounting portion 35 and a rear mounting portion 36 that are spaced apart from each other in the longitudinal direction. These two mounting portions 35, 36 extend transversely with respect to the terminals 32a and 32b and are overmolded onto the terminals. The mounting portions 35, 36 include body portions that are disposed in the space between the terminal pair and may be joined, as illustrated in FIGS. 16-17, to longitudinal portions that define, in effect, sidewalls 37a and 37b of the support frame 34. The two mounting portions 35, 36 are joined to the sidewalls 37a and 37b and cooperatively define an open window 42 that exposes portions of the terminal body portions 39 to air. The sidewalls 37a and 37b may include portions that serve as crush ribs 43 on their upper surfaces, which assist in holding the signal pair elements 30 in place within the connector housing 22. The bottom surface 41 of the support frame 34 is preferably flat as shown in FIG. 20. The rear portion of the bottom surface 41 may include a recess 41a that receives the support frame button 63.

Figure 15:
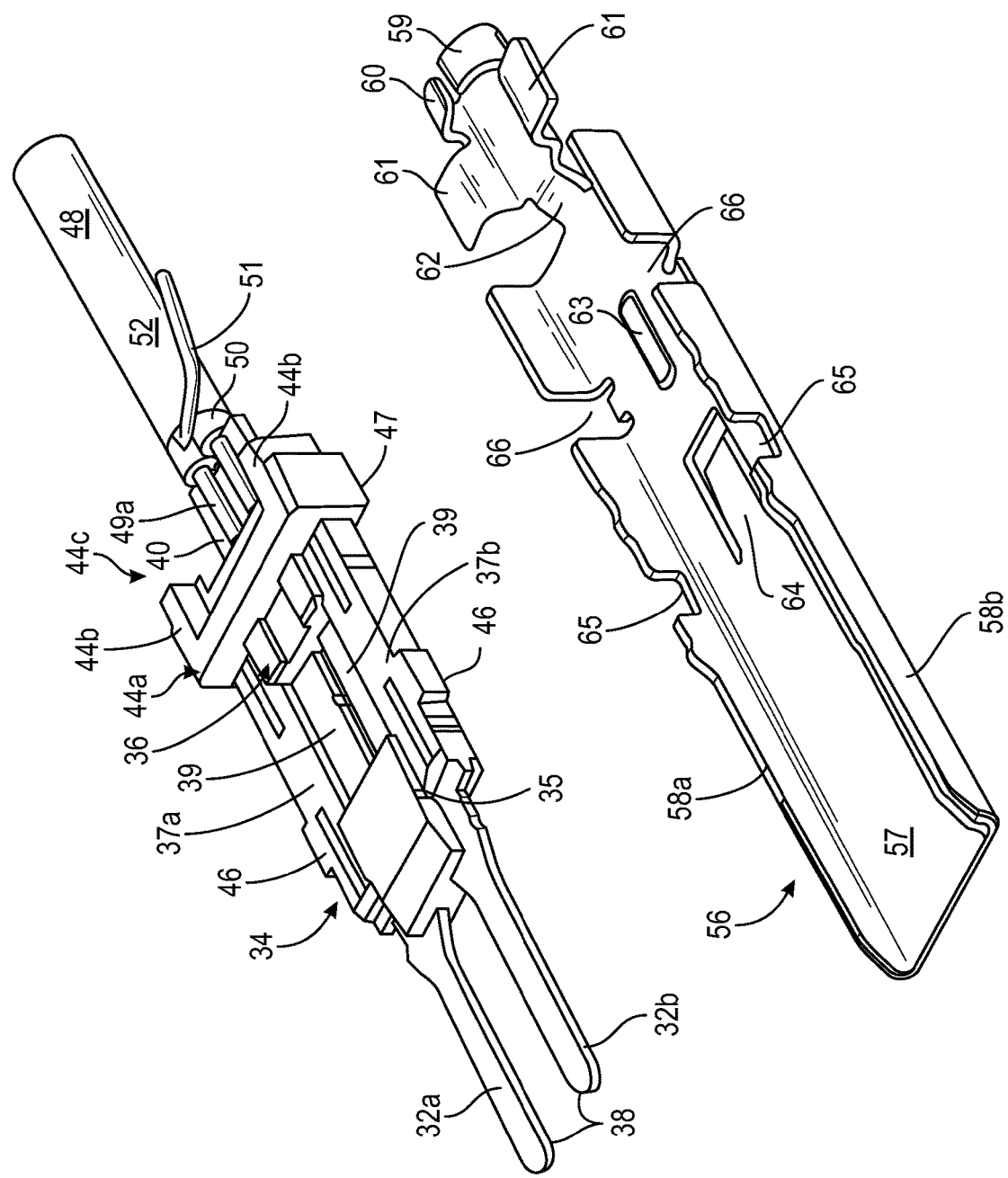
FIG. 15 is a partial exploded view of the signal pair element of FIG. 13, but with the signal pair assembly removed from its ground shield element.
Figure 18:
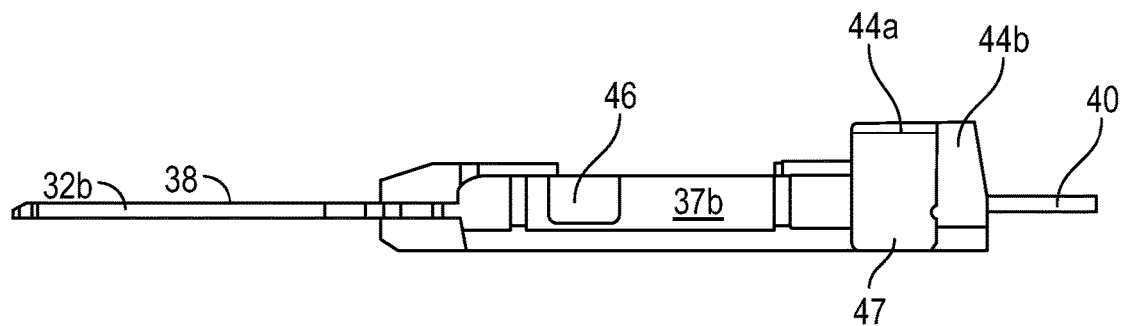
FIG. 18 is a side elevational view of the signal terminal assembly of FIG. 17.

With reference to FIGS. 13, 17 & 18, the support frame 34 is shown as further including an endwall 44a that extends transversely and a pair of shoulder portions 44b that extend longitudinally rearwardly from the endwall 44a to define a termination nest 44c in which the terminal tail portions 40 extend. This area forms an overmolded portion 45 made of insulative material which serves to fix the termination of the signal pair element 30 to the signal cables 48 as well as maintains the signal pair spacing and alignment. The signal pair conductive elements include the aforementioned signal terminals 32a and 32b and also a ground plane element that is shown in the Figures as an elongated ground shield 56. With reference to FIGS. 15 and 16, the ground shield 56 includes a base portion 57 which is generally flat and the shield includes a pair of upturned flanges that define sidewalls 58a and 58b that extend for almost the length of the ground shield 56. The general U-shape that the ground shield 56 has provides a ground plane for each terminal pair that extends along three of the four sides of the terminal pair. Such a structure promotes coupling by the terminals in three different directions. The front end of the ground shield 56 may take the form of a mating blade as shown that provides a flat surface for contacting an opposing ground element of a conventional mating connector.

Figure 14:
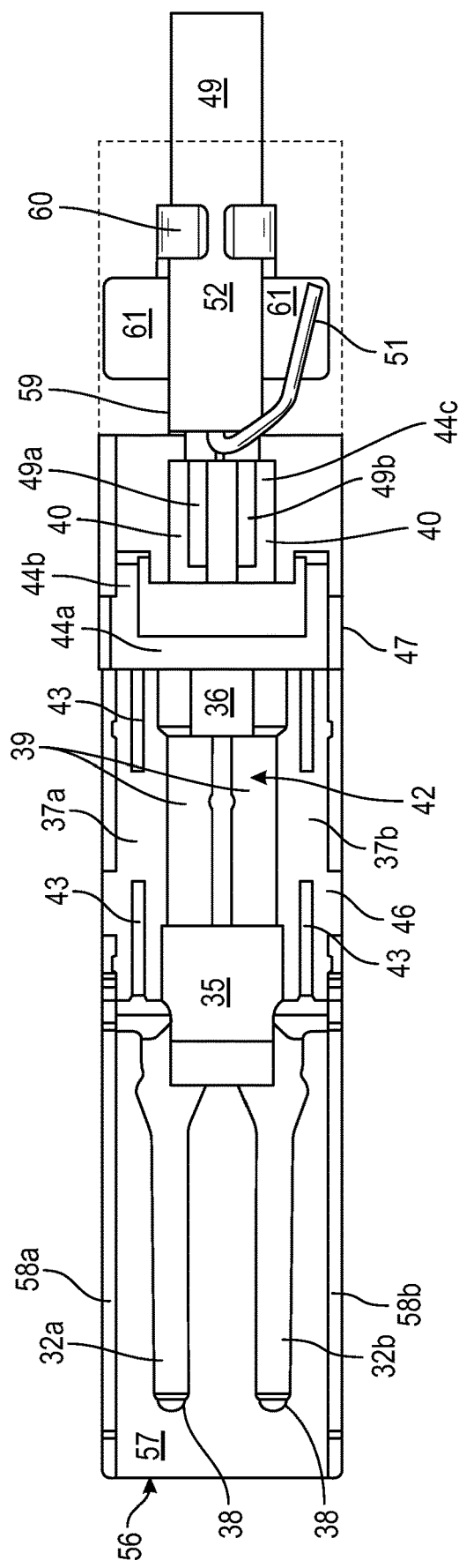
FIG. 14 is a top plan view of the signal pair assembly of FIG. 13.

With reference to FIGS. 13, 14, and 15, the rear end of the ground shield 56 is provided with a cable nest 59 that receives and supports a signal cables 48 having two signal wires 49a and 49b that are surrounded by outer insulative coverings 50. A drain, or ground wire 51, is typically provided for each wire pair 49a and 49b and it extends lengthwise through the wire pair 49a and 49b underneath an outer conductive wrap 52. A free end of the signal cable 48 is prepared as a termination end and has a length of the free end of each wire conductor 49 a, b exposed and the cable drain wire 51 folded back upon the signal cable 48 over the cable outer conductive wrap 52. The cable nest 59 is spaced apart from the ground shield base 57 and offset by way of a tab 62 in the vertical direction from the ground shield base 57, as best illustrated in FIG. 16. The cable nest 59 further includes a cable clamp 60 that has two arm portions 60a that are folded over the signal cable 48 and crimped, or otherwise contacted to the cable outer wrap 52. A pair of stablizing wings 61 extend outwardly from the cable nest 59 and serve to provide reinforcement for the rear, overmolded portion 45 of the element. These wings 61 will provide reinforcement for the overmolded portion 45 of the signal pair element, but also provide a contact platform, or surface, on which the cable drain wire is positioned for soldering. Importantly, the drain wires 51 are folded backwards along the cable outer conductive wrap 52 so that they will not extend anywhere near the exposed free ends of the signal wires 49a and 49b. In this structure, the drain wires 51 extend in a direction opposite the direction in which the free ends of the cable signal wires 49a and 49b extend.

The endwall 44a and shoulders 44b form a horizontal, general U-shape in the horizontal direction that partially encloses the terminal tail portions 40 and they cooperatively form a foundation for the overmolded portion 45 to adhere to the support frame 34 while enclosing the termination area, the cable nest 59 and the free ends of the signal wires 49a and 49b. The cable nest wings 61 are captured by the overmolded portion 45, and the cable nest wings 61 at least partially reinforce the area of the overmolded portion 45 to resist failure during the assembly process if stress is applied to the signal pair elements. This area, as shown in FIGS. 13 and 14, also fills the area between the exposed wire conductors and their associated tail portions with a plastic-type material having a certain dielectric constant so that the impedance of the system in the termination area may be kept close or at a desired level.

Figure 19:
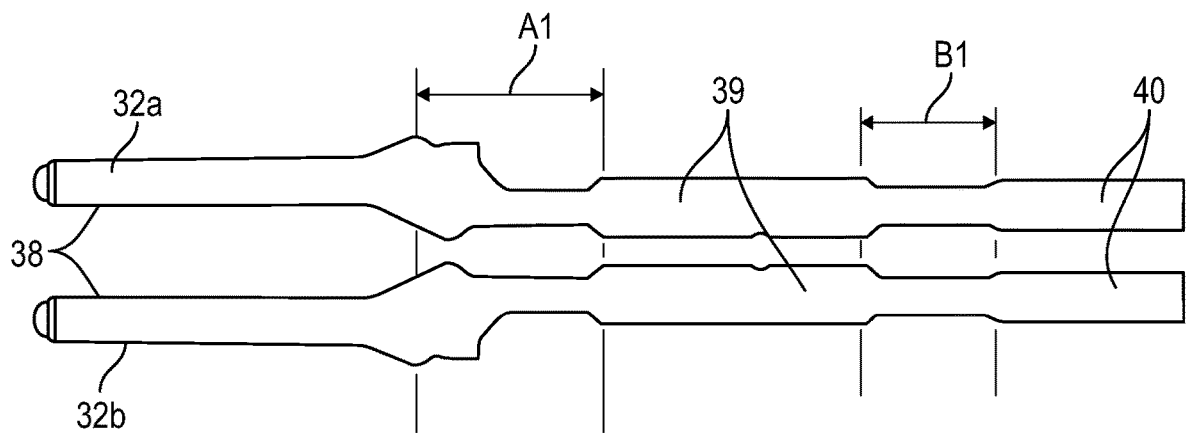
FIG. 19 is a top plane view of a pair of signal terminals used in the terminal assembly of FIG. 17 and removed from their support frame.

With reference to FIGS. 17-19, it will be noted that the signal terminals 32a and 32b have irregular shapes, but are substantially mirror images of each other. In particular, the width of the terminals 32a and 32b are narrowed in two areas, A1 and B1, and these areas occur where the front and rear portions 35, 36 of the support frame 34 engage the terminals 32a and 32b. In these areas, the spaces between the terminals 32a and 32b are filled in with the plastic or resin of the support frame 34 to maintain a desired amount of capacitive coupling between the signal terminals 32a and 32b as well as between the ground shield 56 and the two signal terminals 32a and 32b. The dielectric constant of the support frame material preferably will be greater than the dielectric constant of air (1.0), so that in order to maintain a desired level of coupling between the signal pair 30, and the impedance profile through the signal pair element 30, it is preferred that the terminal widths in these areas are narrowed. The narrowing of the terminals in these two areas also creates edges along the sides of the terminals 32a and 32b that enhance the ability of the support frame material to fix the terminals in their desired spacing. Likewise, the width of the signal terminals 32a and 32b in the window 42 of the support frame 34 is larger than in other areas as the terminals in that area are separated only by air.

The support frame 34 preferably engages the ground shield 56 in a manner that retains it and signal terminals 32a and 32b in a desired proper position. As illustrated in FIGS. 17 and 18, one means for securing the support frame 34 to the ground shield 56 may include pairs of first and second stops 46 and 47 respectively that protrude outwardly from the support frame sidewalls 37a and 37b. With reference to FIG. 15, the first and second stops 46 and 47 are preferably received within corresponding pairs of first and second slots 65 and 66, so that the facing edges of the first and second stops 46 and 47 and the first and second slots 65 and 66 contact each other. The first and second slots 65 and 66 may be configured as illustrated to include indentations or the like that engage protuberances on the first and second stops 46 and 47. An alternate means of engagement may include depressions formed on the support frame 34 and complementary-shaped indentations formed on the ground shield sidewalls 58a and 58b.

With reference to FIG. 15, the ground shield 56 may also include a raised member in the shape of an elongated button 63 that aligns the support frame with the ground shield 56. Elongated button 63 may be embossed, to aid in strength and rigidity of the ground shield 56 at the location of the slots 66. In order to retain the signal pair element 30 in place within the connector housing 22, the ground shield 56 may include a catch portion, shown as a tongue or tab member 64 that is stamped in the ground shield base 57 and formed at an outward angle as shown best in FIGS. 10 and 11 to catch on a secondary shoulder 28 to resist forces that would tend to pull the signal pair elements 30 out of their connector housing openings 26. The support frame endwall 44a confronts and contacts a primary shoulder formed in the connector housing 22 to limit the extent to which the signal pair element may be inserted into the housing opening 26. The openings 26, as shown, have a stepped configuration with central slots 26a and shoulders 26b so that interior surfaces of the shoulders 26b will engage the support frame sidewall crush ribs 43, and the interior surfaces of the slots 26 a (shown at the bottom of the slots of FIG. 9) will engage the ground shield button 63.

Figure 10:
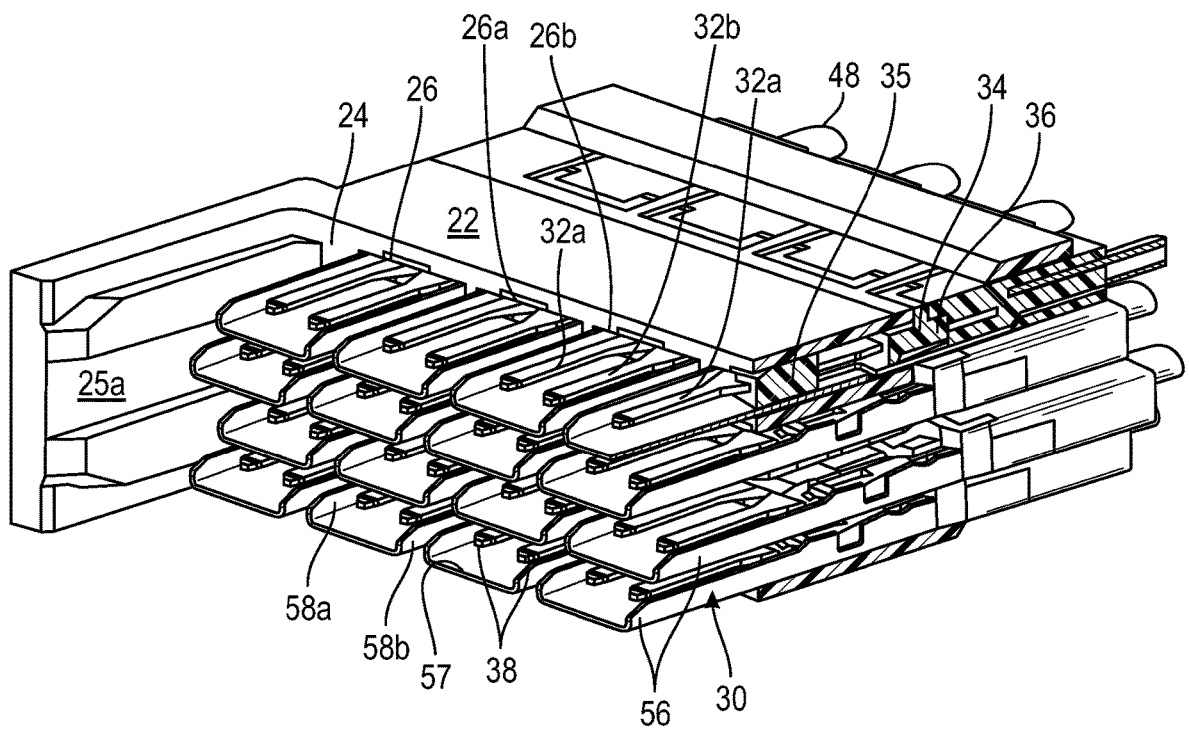
FIG. 10 is a partial sectional view taken along Line A-A of FIG. 8.
Figure 11:
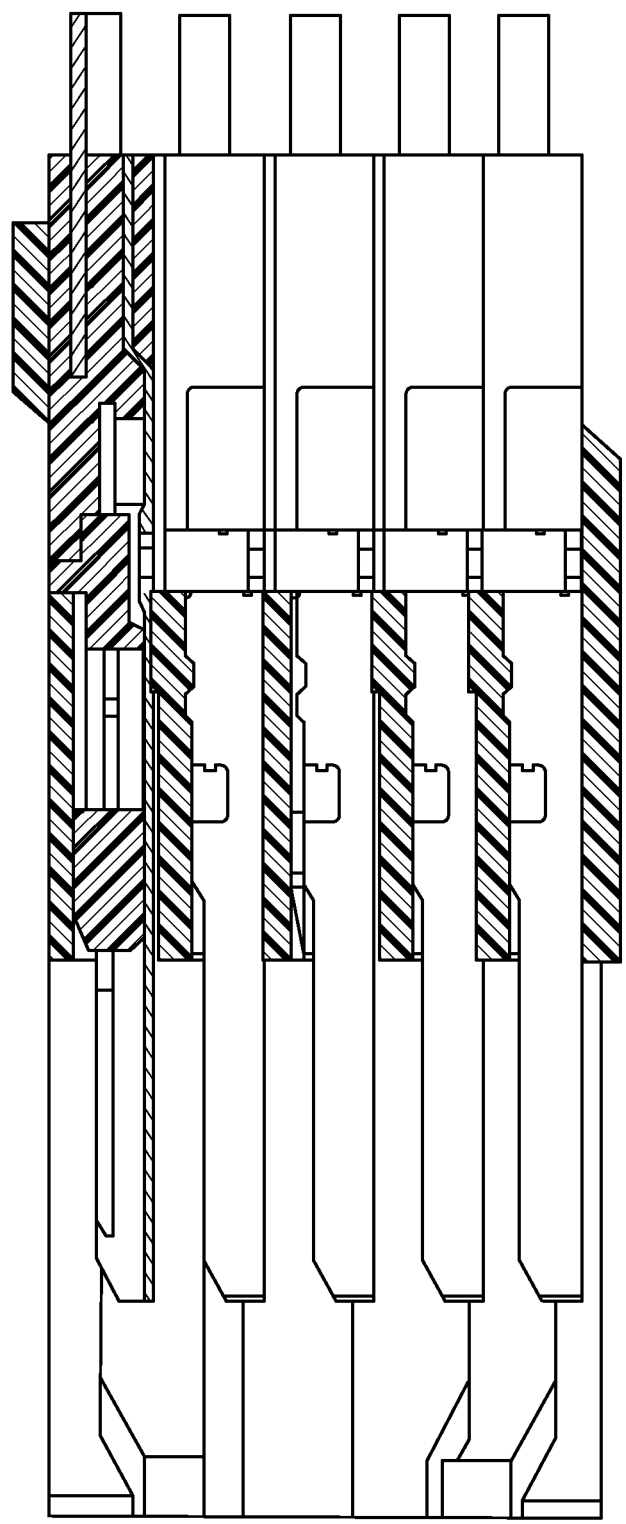
FIG. 11 is a side elevational view of the sectioned portion of FIG. 8.

It can be seen that each of the signal pair elements, or chicklets, 30 form an integrated signal pair with two terminals suitable for transmitting differential signals and which are supported within an associated ground shield that at least partially encloses the terminals on three different sides thereof, leaving only one side with selected surfaces of the terminals exposed. These exposed terminals will be spaced apart from the ground shield bases of the signal pair elements above (or below, depending on the orientation) so that coupling may occur with the ground shield of an adjacent signal pair element. This is best shown in FIG. 10, where, in the staggered arrangement shown, it can be seen the two terminals of each signal pair element in the odd-numbered rows are aligned vertically with each other. Likewise, the terminals of each signal pair element in the even-numbered rows are aligned together in the vertical direction. Furthermore, the right terminal of each pair in the even-number rows 2, 4, 6 and 8 is approximately centered with respect to adjacent ground shields of signal pair elements located above or below in the odd-numbered rows, and the left terminal of each signal pair in the odd-number rows 3, 5 and 7 is approximately centered with respect to adjacent ground shields of the signal pair elements above and below it. The signal pair elements in one row are offset from those in an adjacent row by about 4.7 mm, or about 115 to about 120% of the width of a signal pair element.

This provides connectors utilizing the signal pair element with larger flexibility in design. These chicklets 30 are, in essence, individual building blocks of a signal connector and may be arranged in a variety of different arrangements within a connector housing such as in lettered styles that display a C, H, O, U, X, Y or W configuration. Using such individual building block signal pair elements requires tooling costs only for simple the connector housings, which may only involve a single mold with different inserts, and not a complex one for complex wafers. For a new pair count in a connector design, only the connector housing needs to be tooled. If any signal pair in the connector is bad, only the bad signal pair element need be replaced, rather than discarding the entire wafer. The single signal pair element design therefore minimizes the labor and materials required to only that of a single pair element and not a multi-pair wafer, in which the conductive elements thereof need to be inserted into multiple openings in a connector housing.

FIGS. 22-27 illustrate an alternate embodiment of a signal pair element 70 according to the Present Disclosure, and one that is particularly suitable for use in ganged applications where a plurality of signal pair elements 70 are interconnected to form a linear array 71 of such elements 70. The arrays 70 may then be inserted as a group to speed up the connector assembly process, but each signal pair element, i.e., the terminal pair and ground shield, are still inserted into corresponding single openings 26 of a connector housing 22. It can be seen in FIG. 22 that each signal pair element 70 supports a pair of conductive terminals 72a and 72b and an insulative support frame 73. As with the prior embodiment, the support frame 73 and terminal pairs 72a and 72b are partially encompassed by an associated ground shield 74 that has a general U-shaped configuration with a flat base 74a that is flanked by two sidewalls 74b and 74c. The ground shield base 74a and sidewalls 74b and 74c extend around and partially encompass the terminals 72a and 72b to present a ground plane on at least three sides of the terminal pair, providing coupling in three directions.

Figure 27:
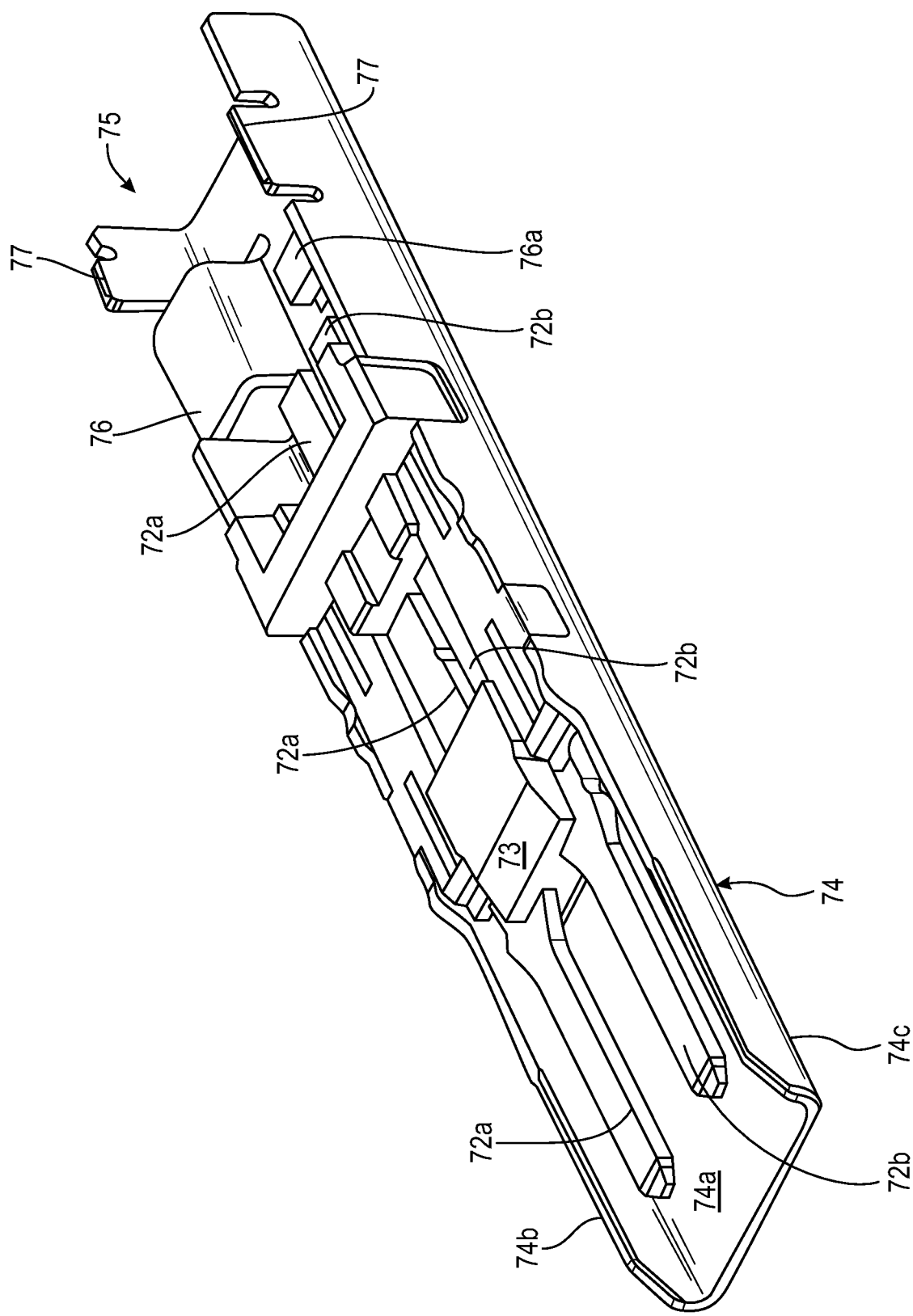
FIG. 27 is the same view as FIG. 26, but with the cable wire pair removed to illustrate the structure of the wire nest.

The rear end of the ground shield 74 includes a wire nest 75 that receives the free ends of a cable signal wire pair 49a and 49b therein. The nest 75 includes portions of the ground shield sidewalls 74b and 74c, and an inner shoulder 76 that is stamped and formed from part of the ground shield 74. Preferably, this inner shoulder 76 contacts the outer conductive wrap 52 of the wire pair 49a and 49b and urges it into contact with the opposing sidewall 74c of the ground shield 74. A second lower shoulder 76a may be provided as shown in FIG. 27 which provides a second point of contact between the wire outer wrap 52 and the ground shield 74 along the bottoms of the wire pair 49a and 49b. The top surface 74b of the inner shoulder provides a surface to which the wire pair drain wire 51 may be connected.

A commoning member 78 is provided to interconnect multiple signal pair elements 70 by way of their ground shields. The commoning member 78 extends transversely across the ground shield 74 and engages the ground shield sidewalls 74b and 74c by way of complementary shaped shield tabs 77 and commoning member slots 79. The commoning member 78 extends transversely with respect to the signal pair element 70 and may include, as illustrated, a raised bump or detent, 80 that accommodates the difference in heights between drain wire 51 and the cable pair outer wrap 53. The commoning member 78 may be a singular member, that is, extending across only a single signal pair element ground shield, or it may extend further transversely and commonly connect multiple signal pair elements by way of their associated ground shields in the fashion of a linear array. As such, the commoning member 78 of this embodiment 70 serves a similar purpose as the wire nest ground clamp 60 of the prior embodiment.

An insulative material 82 is molded over the terminal tail portions, the wire pair free ends, the ground shield 74 and the commoning member 78 to form a structure that interconnects the signal pair elements 70 together in a linear array 71 that holds individual signal pair elements 70 in a desired arrangement. Although shown as an entirely linear array, it will be understood that the signal pair elements of such array may be out of plane, as if they were interconnected in an alternating arrangement of peaks and valleys or if they were interconnected in a vertical direction. The integrated structure of the singular signal pair element that permits single insertion of such elements into single openings of a connector housing permits the interconnection or ganging of multiple elements together to form arrays of elements. Such arrays will cut down the time needed for insertion of singular elements while still maintaining the integrated structure of the signal pair element which permits insertion of a single signal pair element into a single opening of a connector housing.

As shown in FIGS. 1 and 2, the Present Disclosure provides a plurality of individual power connectors 110, which are insertable into the primary connector housing 104 or secondary connector housing 22 such that the conductive elements thereof project through the connector housings 104, 22 in alignment with an opposing hybrid mating connector (not shown). Primary backplane connector 102 includes primary power connectors 110a and secondary backplane connector 20 includes secondary power connectors 110b. Primary and secondary power connectors 110a and 110b each contain at least one power connector 110. A pair of primary power cables 116, 117 connects primary power connector 110a with a power supply unit while a pair of secondary power cables 98, 99 connect secondary power connector 110b with a power supply unit. Connector 110 is located within the connector housings 104, 22 and includes a pair of high current interconnects 112a and 112b. High current interconnects 112a and 112b are capable of carrying a current load. A current design may utilize a 3.4 mm CST pin product that can carry up to 75A max while maintaining less than 30° C. temperature rise. The preferred range is based off of each specific application but can utilize a larger 6.0 mm or 8.0 mm CST product and larger AWG cables as needed. In one embodiment, each high current interconnects 112a and 112b is part of the Coeur High-Current Interconnect System manufactured by Molex, Inc. of Lisle, Illinois. Preferably, the pair of high current interconnects 112a and 112b are capable of delivering up to 200A of current and offer a wide range of configurations, connecting with PCBs, busbars, and cables. Since it is difficult to have perfect pin-to-socket alignment when mating two rigid PCBs, bus bars, or interconnects, a degree of float is needed in these situations to accommodate any misalignment there may be. This diversity serves to assure ease of mating and also prevents potential damage to the socket contacts of interconnects 112a and 112b.

Figure 7:
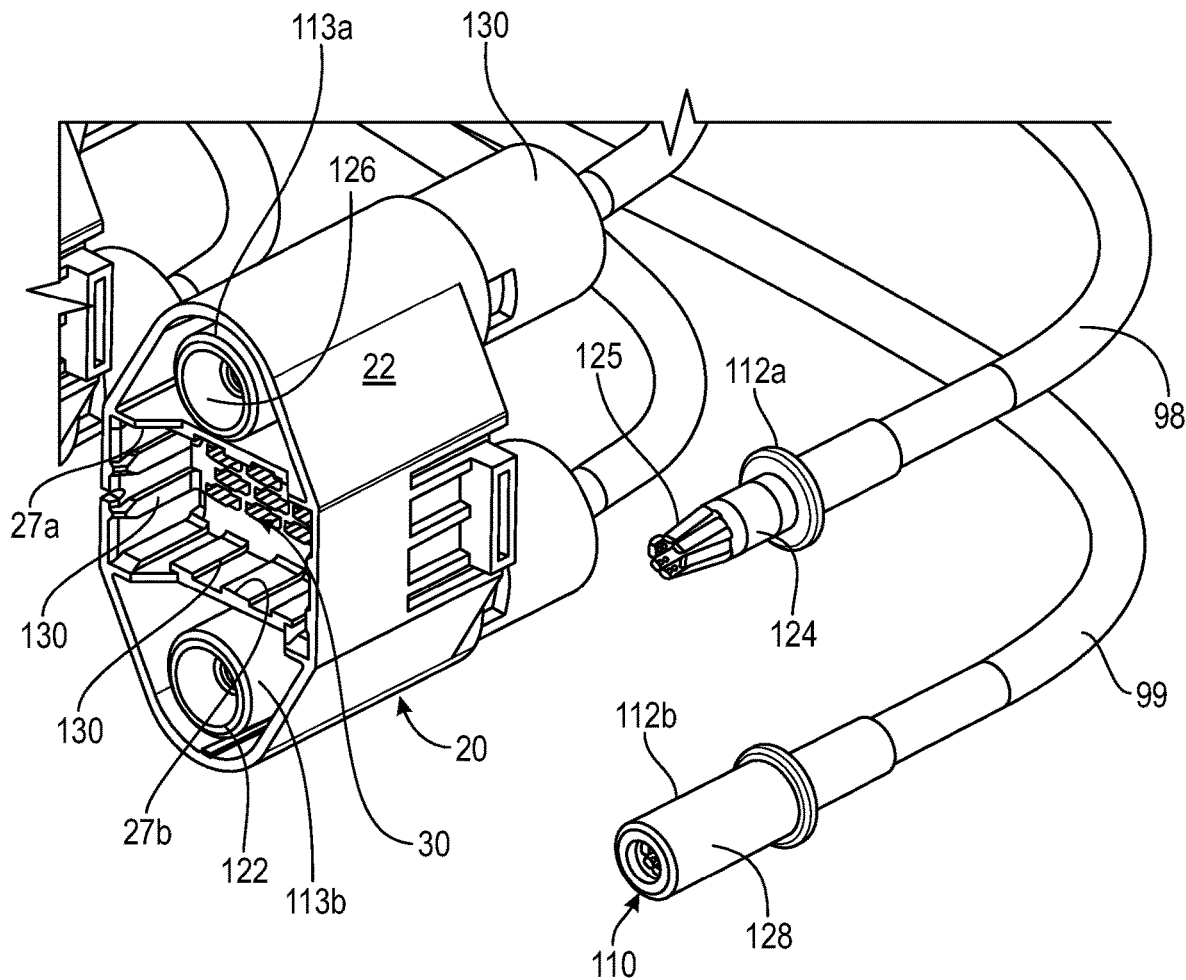
FIG. 7 is an enlarged partial front perspective view of the cable harness shown in FIG. 3 with one hybrid backplane connector removed from the power cables displaying a pin and an internal contact of the power cables connected with the power connectors, in accordance with one embodiment of the present invention.

With reference to FIG. 7, an enlarged perspective view of power connector 110 with high current interconnects 112a and 112b is shown. High current interconnects 112a and 112b each include a female, plug type connector 126 each of which is fitted in a shaft 113a. 113b formed in the housing 22, respectively. Each shaft 113a, 113b, forms a leading outer surface 122 which provides float for and guides a male pin connected of an opposing hybrid connector (not shown) towards each respective high current interconnects 112a and 112b. Each female connector 126 has a leading outer surface 128 which formed a shaft that provides float to and mates with a male pin connected of an opposing hybrid connector (not shown). Within the shaft of each female connector 126 is formed a plurality of concentric guide arms 125 which are all bent inwards towards the center of the shaft in order to mate with and grasp the male pin of an opposing hybrid connector (not shown). The leading outer surfaces 122 and 128 help guide the male pin into the female connector 126 and provides a leading edge and float for a preliminary, rough alignment of the opposing hybrid connector with either primary or secondary hybrid connectors 102, 20.

Preferably, the housings 104, 22 of primary and secondary hybrid connectors 102, 20 form mating ridges 130 to provide a secondary float for a fine alignment of the opposing hybrid connector with either primary or secondary hybrid connectors 102, 20. Specifically, ridges 130 formed in the housings 104, 22 preferable around signal pair elements 30, provide for a more fine alignment to help align the signal pair elements 30 with opposing signal pair elements in the opposing hybrid connector. In one embodiment, ridges 130 are formed along sidewalls 25a and 25b and top and bottom walls 27a and 27b which surround signal pair elements 30a. The opposing connector would have opposing ridges which mate with the ridges 130 of the connector housings 104, 22, to assures ease of mating and prevent potential damage to the contact portions 38 of signal pair elements 30.

Figure 4:
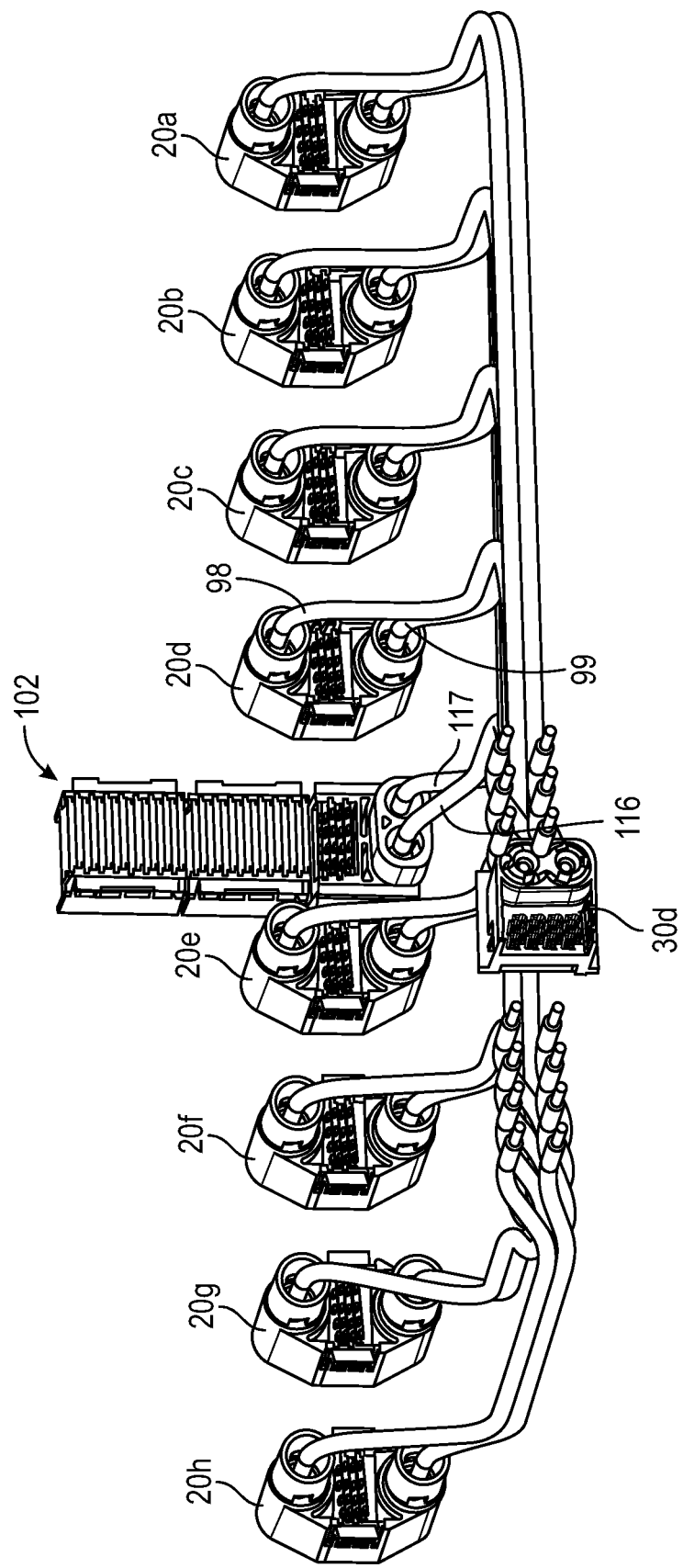
FIG. 4 is a partial rear perspective view of the cable harness shown in FIG. 3, in accordance with one embodiment of the present invention.
Figure 5:
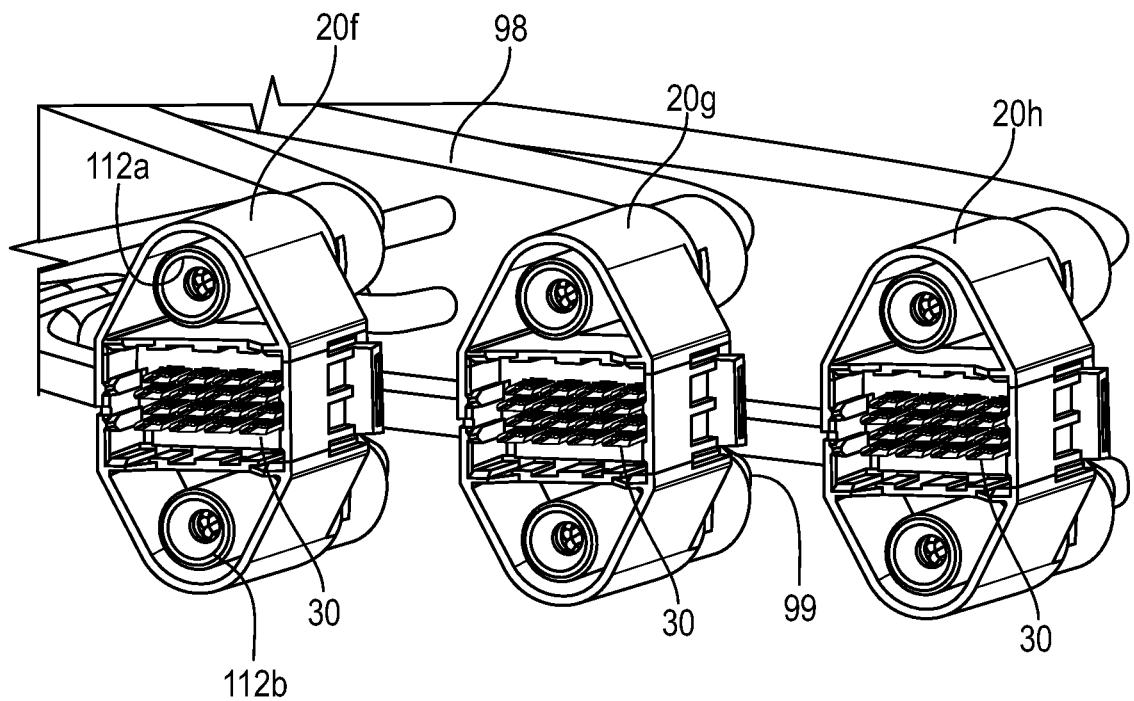
FIG. 5 is an enlarged partial front perspective view of the cable harness shown in FIG. 3, in accordance with one embodiment of the present invention.
Figure 6:
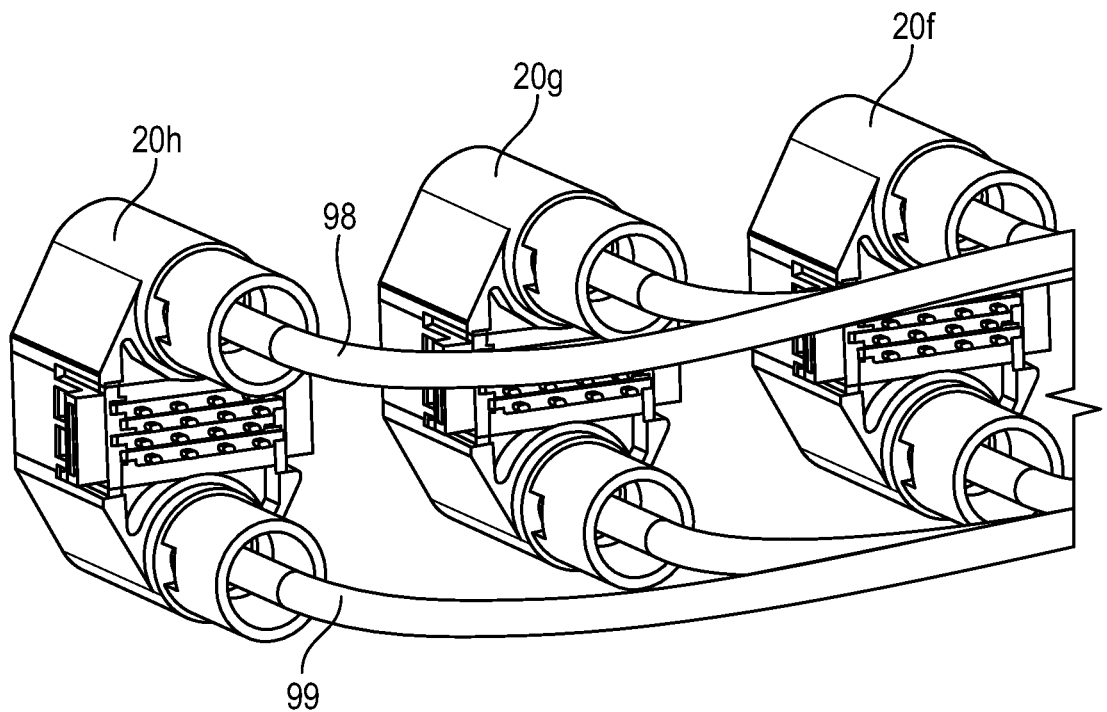
FIG. 6 is an enlarged partial rear perspective view of the cable harness shown in FIG. 3, in accordance with one embodiment of the present invention.

One of the high current interconnects 112a and 112b is used to supply power and the second of the high current interconnects 112a and 112b provides grounding. With reference to FIGS. 1 and 2, in one embodiment, both high current interconnects 112a and 112b are placed either below or above the signal pair elements 30. With reference to FIGS. 3 and 4, a first high current interconnect 112a is placed above signal pair elements 30 in and a second high current interconnect 112b is placed below the signal pair elements 30. While this arrangement is illustrated in FIGS. 3 and 4 only with respect to secondary hybrid connector 20, it may also exist with respect to primary hybrid connector 102 as well.

By mounting both a power connector 110 and signal pair elements within a single housing 104, 22, airflow within a case (not shown) in which the cable harness 100 is mounted within can be substantially improved in comparison to prior art connectors.

With reference to FIGS. 3-6, a primary signal cable 114 connects the primary signal pair elements 30a of the primary hybrid connector 102 with the secondary signal pair elements 30b of the secondary hybrid connector 102. Furthermore, the pair of primary power cables 116, 117 connect the primary power connector 110a with a power supply unit (not shown) and the pair of secondary power cables 98, 99 connect the secondary power connector 110b with a power supply unit (not shown).

With reference to FIGS. 3 and 4, in one embodiment, the cable harness 100 includes secondary or alternate signal cabling 115 connecting a first alternate signal pair element 30c of the primary hybrid signal and power backplane connector 102 with a second alternate signal pair element 30d of an internal hybrid signal and power backplane connector 136. Preferably, alternate power cabling 118 connecting the primary power connector 110 with an alternate power connector 119 of the internal hybrid signal and power backplane connector 136. The internal hybrid signal and power backplane connector 136 is preferably connected with, communicates with and powers a fan unit within the case (not shown) and the primary hybrid signal and power backplane connector 102 is connected with a management computer (not shown). Preferably, the management computer controls operation of the fan unit in the case via the cable harness 100, and more specifically through alternate signal pair elements 30c and 30d which are connected via an alternate signal cable 115.

With reference to FIG. 1, in one embodiment, the primary hybrid signal and power backplane connector 102 communicates data with and provides power to a plurality of compute units (not shown) via a plurality of secondary hybrid signal and power backplane connectors 20a-20h. Preferably, each secondary hybrid signal and power backplane connector 20a-20h is connected with one of the compute units to communicates data with and provide power to the compute unit.

With reference to FIG. 1, in one embodiment, the primary hybrid signal and power backplane connector 102 is connected with a management computer (not shown) to communicate data with and provide power to the management computer. Preferably, the management computer receives data from and sends instructions to each compute units via the primary hybrid signal and power backplane connector 102 and the secondary hybrid signal and power backplane connectors 20a-20h.

Figure 28:
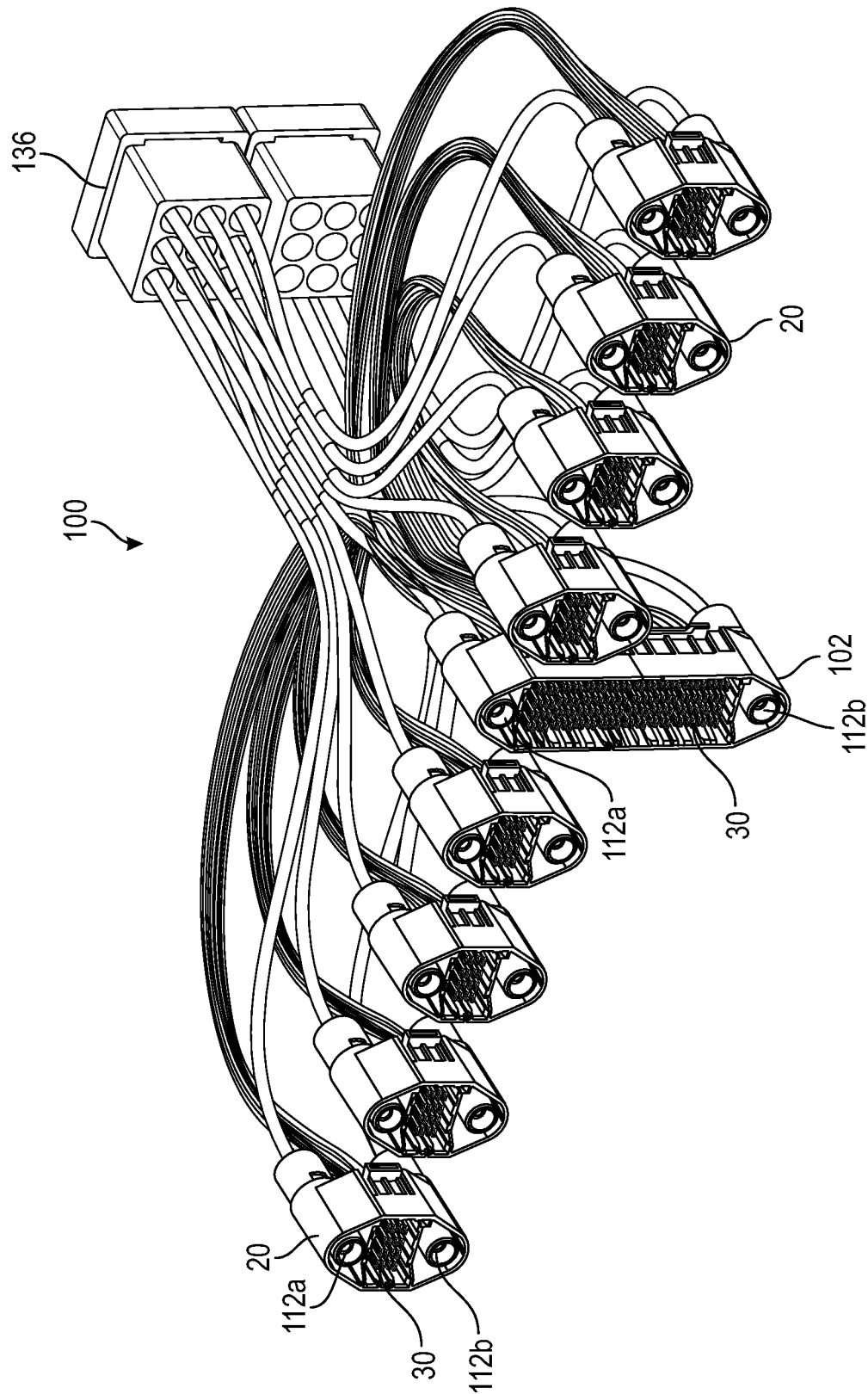
FIG. 28 is a front perspective view of a cable harness having multiple hybrid backplane connectors with power connectors located above and beneath the signal pair elements, in accordance with one embodiment of the present invention.
Figure 29:
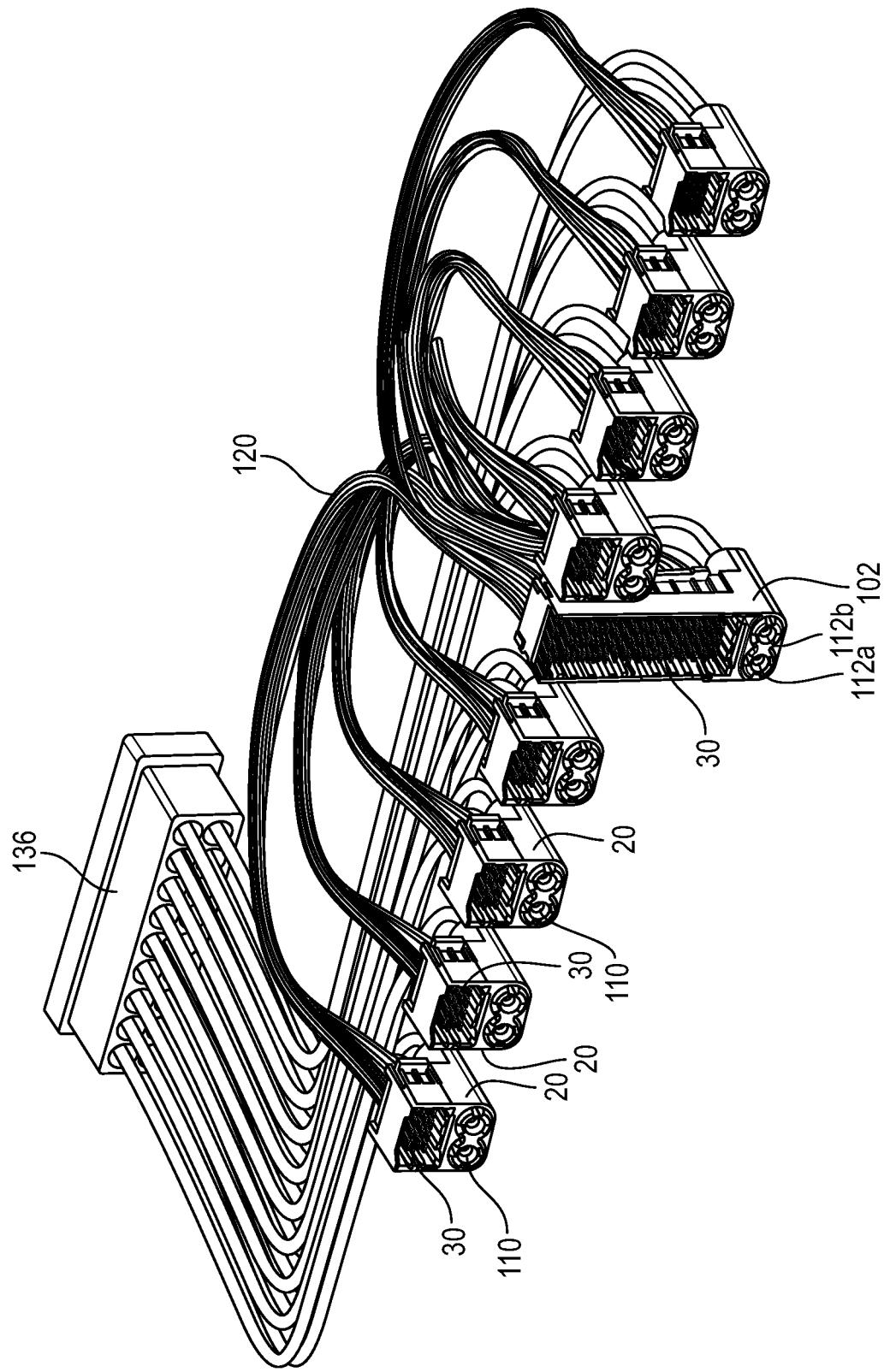
FIG. 29 is a front perspective view of a cable harness having multiple hybrid backplane connectors with power connectors located beneath the signal pair elements, in accordance with one embodiment of the present invention.

With reference to FIG. 28, in one embodiment, the primary hybrid signal and power backplane connector 102 includes one high current interconnect 112a above the signal pair elements 30 and one high current interconnect 112b located below the signal pair elements 30. In this embodiment, the secondary hybrid signal and power backplane connector 20 also includes one high current interconnect 112a above the signal pair elements 30 and one high current interconnect 112b located below the signal pair elements 30. With reference to FIG. 29, in one embodiment, the primary hybrid signal and power backplane connector 102 includes both high current interconnects 112a, 112b below the signal pair elements 30. In this embodiment, the secondary hybrid signal and power backplane connector 20 also includes both high current interconnects 112a, 112b below the signal pair elements 30. In one embodiment, the secondary hybrid signal and power backplane connector 20 includes both high current interconnects 112a, 112b either above or below the secondary signal pair element 30.

Figure 30:
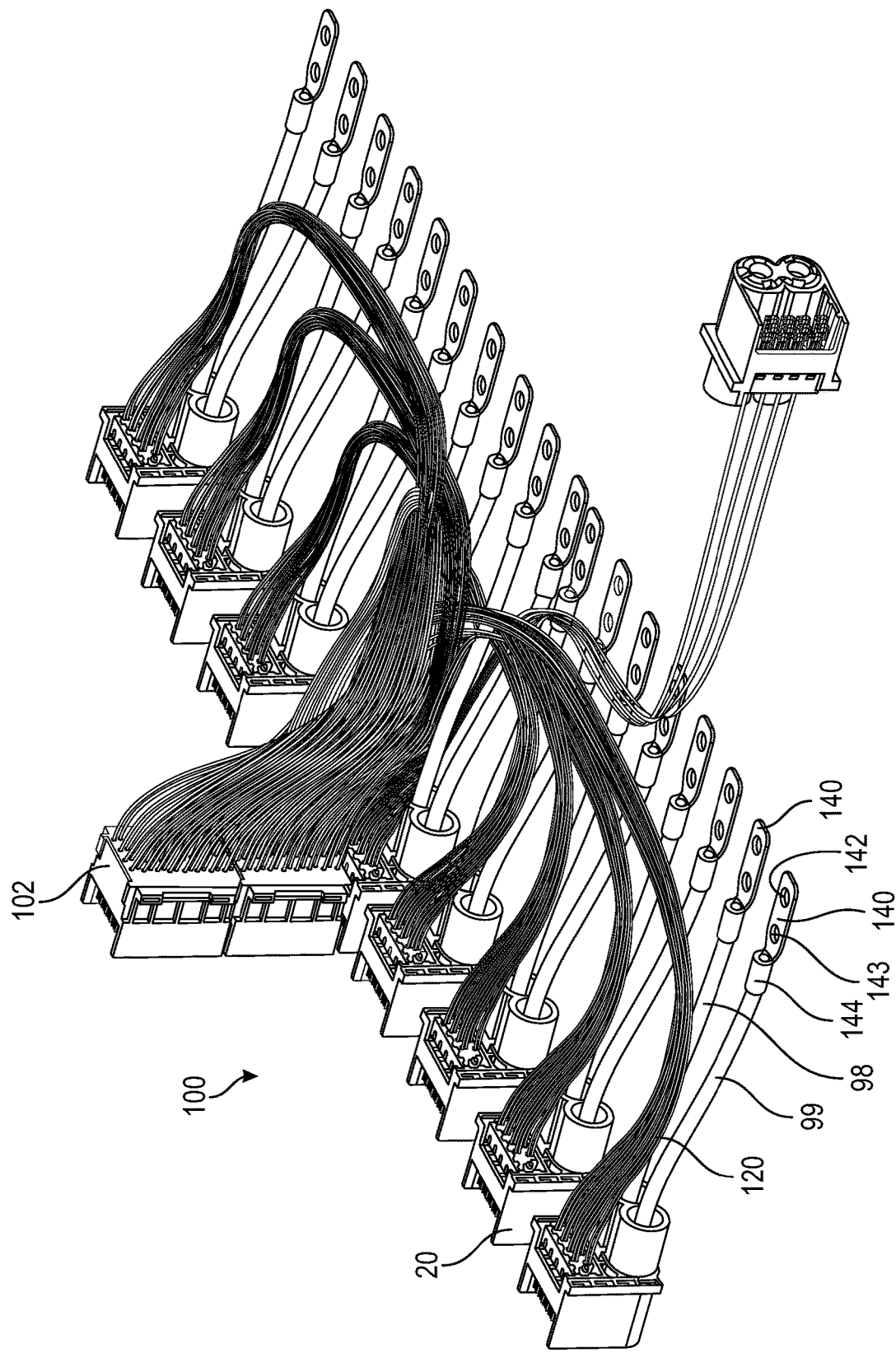
FIG. 30 is a rear perspective view of a cable harness having multiple hybrid backplane connectors with power connectors located beneath the signal pair elements and which are terminated using lugs, in accordance with one embodiment of the present invention.

With reference to FIG. 30, in one embodiment, the power cables 98, 99 emanating from each primary hybrid signal and power backplane connector 102 and each secondary hybrid signal and power backplane connector 20 route back behind the connectors 102, 20 and are terminated with two hole crimp lugs 140 on the opposite ends using a crimp connector 144. Each lug 140 forms a pair of holes 142, 143 through which an attachment member, such as a screw, placed through to fix and secure the lugs 140 to another member. In one embodiment, the two hole crimp lugs 140 will mount to a flat busbar (not shown) with press-fit threaded studs and secured with bolts that screw onto the threaded studs for reduced cost and reduced power loss.

Figure 31:
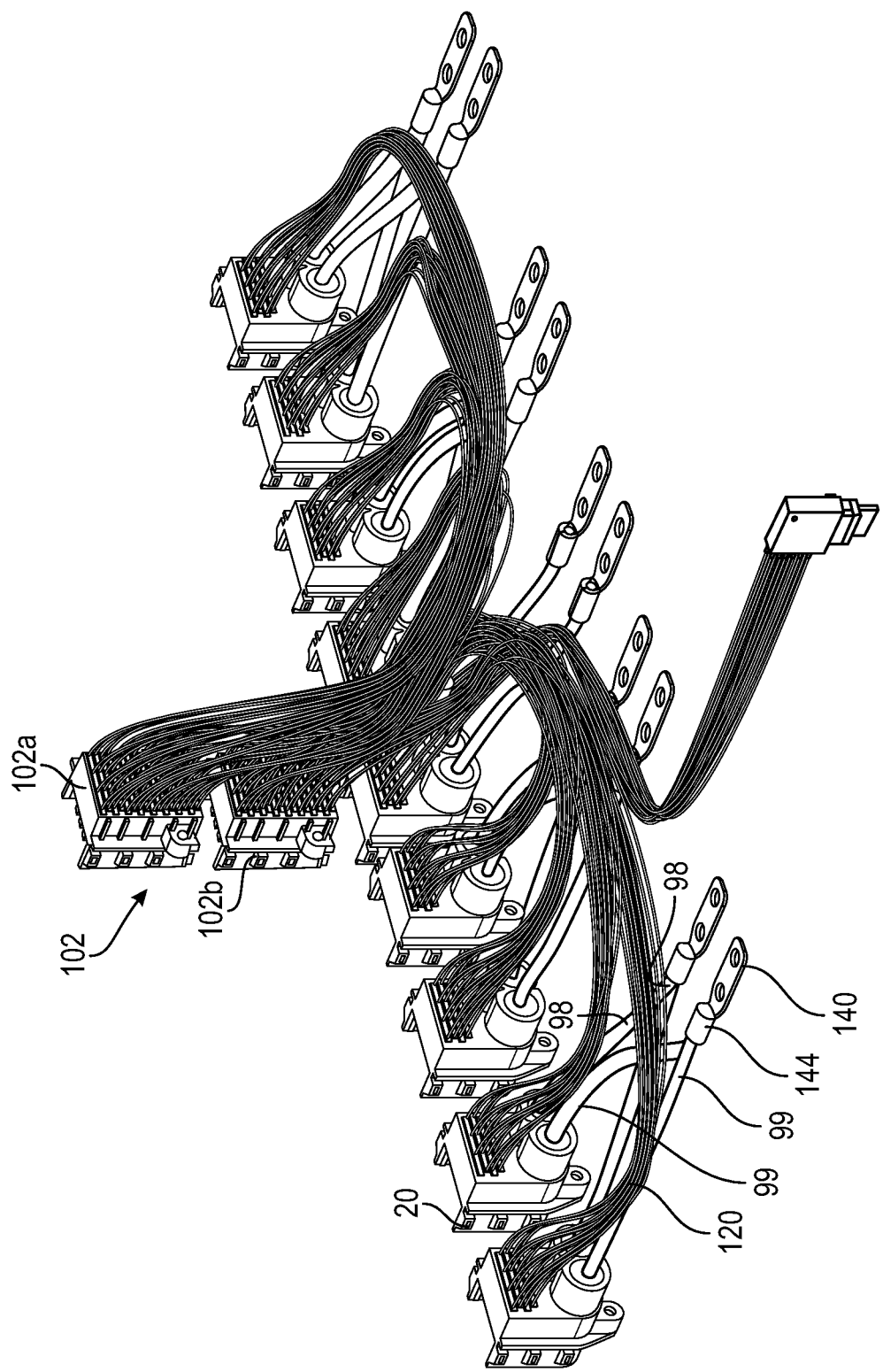
FIG. 31 is a rear perspective view of a cable harness having multiple hybrid backplane connectors with power connectors crimped together and located beneath the signal pair elements and which are terminated using lugs, in accordance with one embodiment of the present invention.
Figure 32:
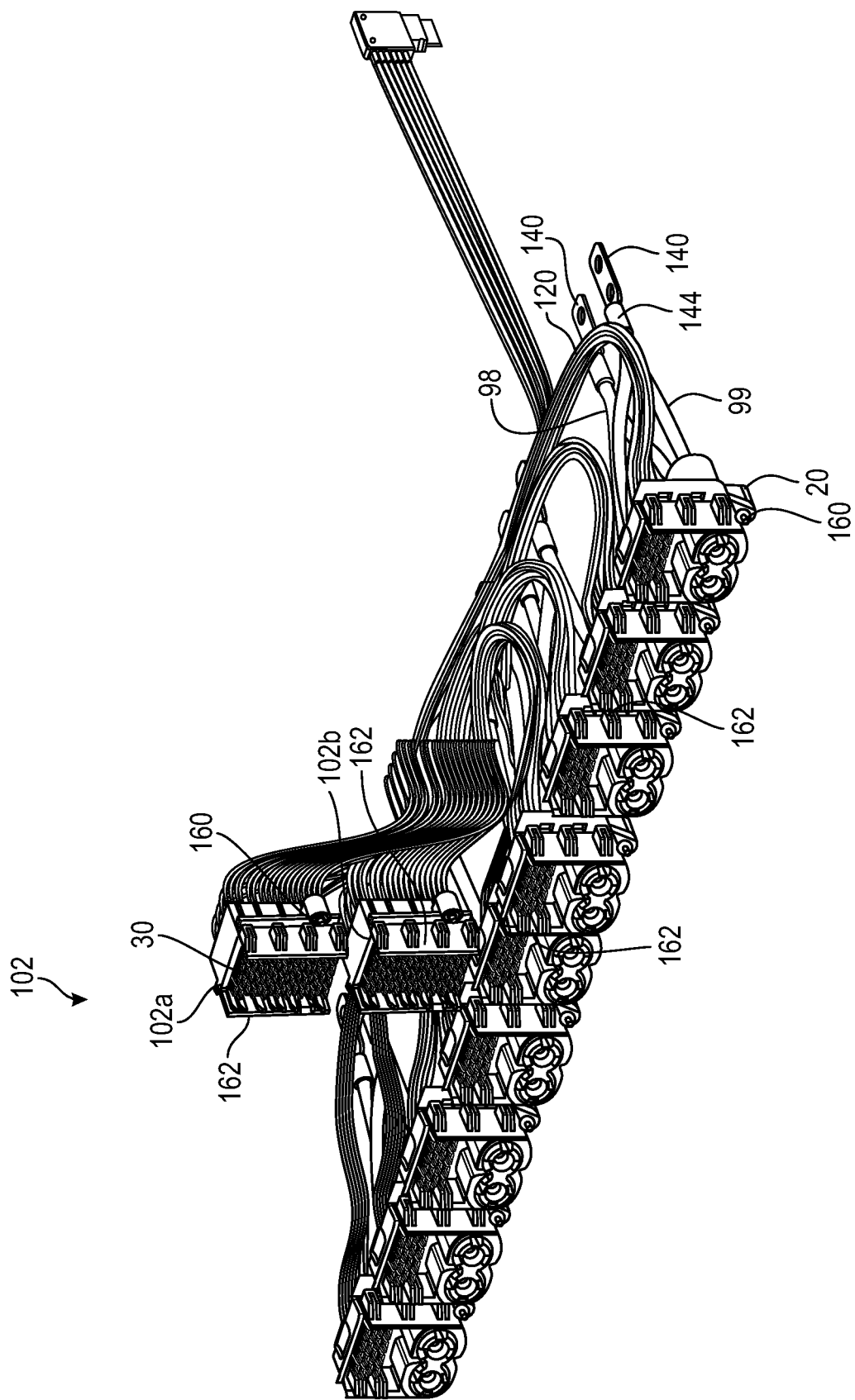
FIG. 32 is a front perspective view of a cable harness having multiple hybrid backplane connectors with power connectors crimped together and located beneath the signal pair elements and which are terminated using lugs, in accordance with one embodiment of the present invention.

With reference to FIGS. 31-32, in one embodiment, pairs of negative power cables 99 are crimped together using crimp connector 144, and pairs of positive power cables 98 are crimped together using another crimp connector 144, each crimp connector connected to a lug 140. In this manner, by pairing positive and negative power cables 99, 99 and crimping them together to one lug 140, the number of lugs 140 may be reduced and installation of lugs 140 onto the busbar (not shown) will be simplified. The power cables 98, 99 may be crimped, soldered or welded to crimp connector 144 which in attached to lug 140 which is then removably connected to the busbar. Preferably, the power cables 98, 99 are ultrasonically welded to crimp connector 144. Such an arrangement reduces power loss over the previously discussed arrangement.

With reference to FIG. 32, in one embodiment, the primary backplane connector 102 includes multiple connector housings 102a and 102b which each house an array of signal pair elements 30.

Figure 33:
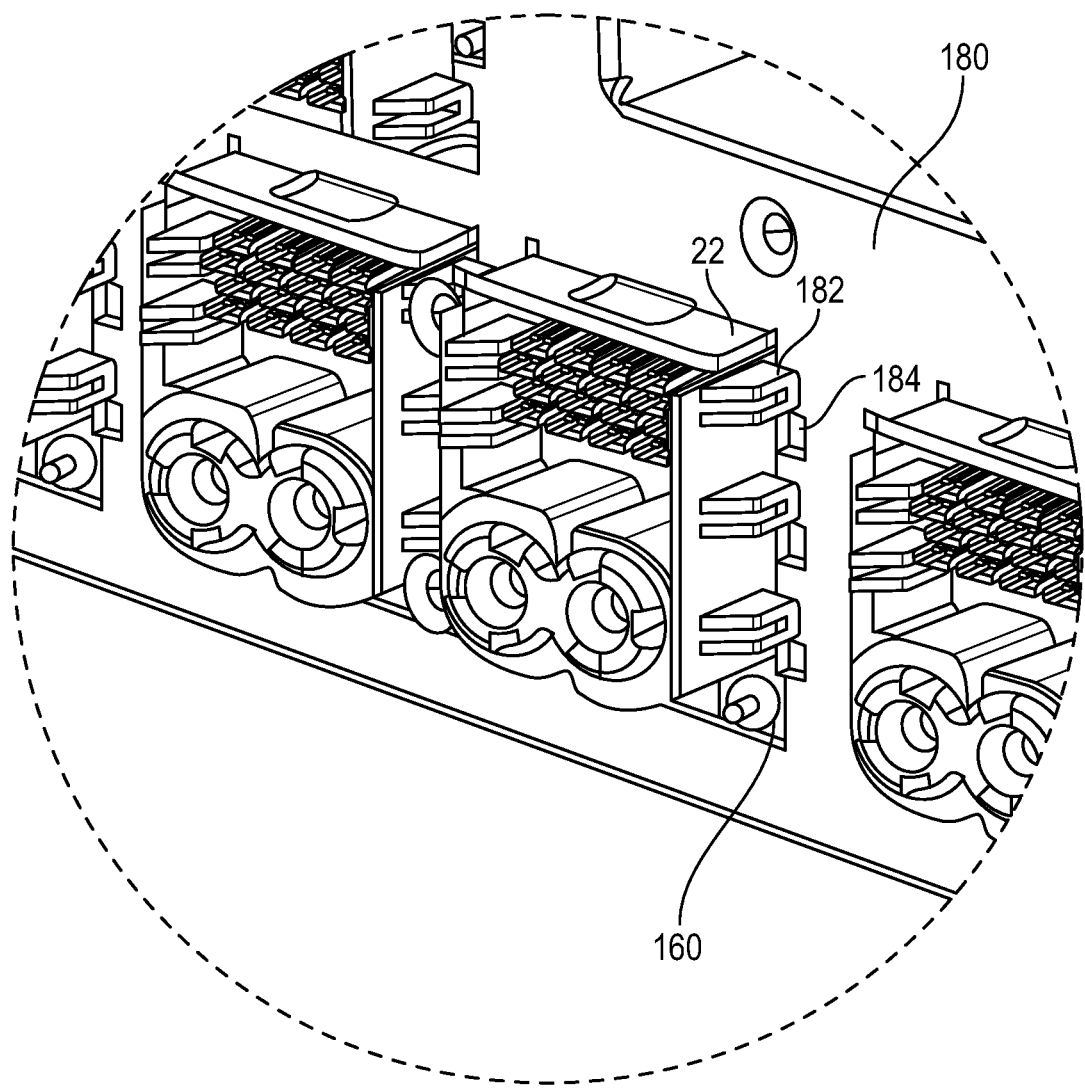
FIG. 33 is an enlarged front perspective view of a cable harness having multiple hybrid backplane connectors connected to a backplate, in accordance with one embodiment of the present invention.

With reference to FIG. 33, in one embodiment, connector housing 22 includes a pushpin member 160 and a pair of snap-fit members 162 along each side of the connector housing 22 which allows the connector housing 22 to be snap-fit into an enclosure 200. The snap-fit members 162 retain the sides of the connector housing 22 to the enclosure 200 along with the pushpin member 160, as shown in FIG. 33. In order to remove the connector housing 22 from the enclosure 200, pushpin members 160 must be depressed and the connector housing 22 is pushed out from the enclosure 200. Preferably, pushpin members 160 are press-fit spring plungers and have an asymmetrical design.

Preferably, connector housing 22 forms at least one and preferably a series of flanges 182 along a side or multiple sides of the connector housing 22. In order to fix the connector housing 22 to the backplate 180, the flange 182 is pushed through an opening 184 and then slid along backplate 180 until pushpin 160 extends out and locks the connector housing 22 to the backplate 180. In order to remove the connector housing 22 from the backplate 180, pushpin 160 is depressed. Upon depressing pushpin member 160, the connector housing 22 is then slid until the flange 182 is aligned with the opening 184 and pushed out through the opening 184 and released from the backplate 180. In this manner the connector housing 22 can be either connected with or removed from the backplate 180 with relative ease and accuracy.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A cable harness for use in a backplane, comprising:
a primary hybrid signal and power backplane connector having a primary housing, a primary signal pair element located within the primary housing having a pair of elongated primary terminals, and a primary power connector located within the primary housing and including a pair of high current interconnects;
a secondary hybrid signal and power backplane connector having a secondary housing, a secondary signal pair element located within the secondary housing having a pair of elongated terminals, and a secondary power connector located within the secondary housing and including a pair of high current interconnects;
a primary signal cable connecting the primary signal pair element with the secondary signal pair element;
a pair of primary power cables connecting the primary power connector with a power supply unit; and
a pair of secondary power cables connecting the secondary power connector with the power supply unit.

2. The cable harness of claim 1, further comprising secondary signal cabling connecting a first alternate signal pair element of the primary hybrid signal and power backplane connector with a second alternate signal pair element of an internal hybrid signal and power backplane connector.

3. The cable harness of claim 2, further comprising alternate power cabling connecting the primary power connector with an alternate power connector of the internal hybrid signal and power backplane connector.

4. The cable harness of claim 3, wherein the internal hybrid signal and power backplane connector is connected with a fan unit and the primary hybrid signal and power backplane connector is connected with a management computer, and wherein the management computer controls operation of the fan unit via the cable harness.

5. The cable harness of claim 1, wherein the primary hybrid signal and power backplane connector communicates data with and provides power to a plurality of compute units via a plurality of secondary hybrid signal and power backplane connectors, and wherein each secondary hybrid signal and power backplane connector is connected with one of the compute units to communicates data with and provide power to the compute unit.

6. The cable harness of claim 5, wherein the primary hybrid signal and power backplane connector is connected with a management computer to communicate data with and provide power to the management computer, wherein the management computer receives data from and sends instructions to each compute unit via the primary hybrid signal and power backplane connector and the secondary hybrid signal and power backplane connector.

7. The cable harness of claim 1, wherein the secondary hybrid signal and power backplane connector includes one high current interconnect above the secondary signal pair element and one high current interconnect located below the secondary signal pair element.

8. The cable harness of claim 1, wherein the secondary hybrid signal and power backplane connector includes the pair of high current interconnects either above or below the secondary signal pair element.

9. The cable harness of claim 1, wherein each primary terminal extends longitudinally and is spaced apart from each other, wherein each primary terminal includes a contact portion and a tail portion disposed at opposite ends thereof, the contact and tail portions being interconnected by a body portion, and wherein each primary terminal also includes an insulative support frame supporting each primary terminal and a ground shield.

10. The cable harness of claim 9, wherein the ground shield includes a cable nest that supports the primary signal cable, wherein the primary signal cable includes two conductors, wherein the primary signal cable is secured in the cable nest, wherein each one of the two conductors are connected to the tail portion of each primary terminal.

11. The cable harness of claim 10, wherein the insulative support frame includes an opening disposed between front and rear portions of the insulative support frame, exposing portions of the body portion to air.

12. The cable harness of claim 10, wherein the primary signal cable includes a drain wire that is attached to the cable nest.

13. The cable harness of claim 12, wherein the drain wire is folded back and soldered to the cable nest along a side of the primary signal cable.

14. The cable harness of claim 10, wherein the insulative support frame is configured to allow a portion of the body of each primary terminal to be edge-coupled in air.

15. The cable harness of claim 10, wherein each high current interconnect includes a crimp socket.

16. A cable harness for use in a backplane, comprising:
a primary hybrid signal and power backplane connector having a primary housing, wherein the primary housing includes a primary signal pair element and a primary power connector; and
a secondary hybrid signal and power backplane connector having a secondary housing, wherein the secondary housing includes a secondary signal pair element and a secondary power connector, wherein the primary hybrid signal and power backplane connector is connected with the secondary hybrid signal and power backplane connector with a signal cable, and wherein each of the primary and secondary hybrid signal and power backplane connectors is electrically connected with a power supply unit each via a power cable.

17. The cable harness of claim 16, further comprising secondary signal cabling connecting a first alternate signal pair element of the primary hybrid signal and power backplane connector with a second alternate signal pair element of an internal hybrid signal and power backplane connector.

18. The cable harness of claim 17, further comprising alternate power cabling connecting the primary power connector with an alternate power connector of the internal hybrid signal and power backplane connector.

19. The cable harness of claim 18, wherein the internal hybrid signal and power backplane connector is connected with a fan unit and the primary hybrid signal and power backplane connector is connected with a management computer, and wherein the management computer controls operation of the fan unit via the cable harness.

20. The cable harness of claim 16, wherein the primary hybrid signal and power backplane connector communicates data with and provides power to a plurality of compute units via a plurality of secondary hybrid signal and power backplane connectors, and wherein each secondary hybrid signal and power backplane connector is connected with one of the compute units to communicate data with and provide power to the compute unit.

* * * * *